(12) United States Patent
Haba et al.

(10) Patent No.: US 8,735,287 B2
(45) Date of Patent: May 27, 2014

(54) SEMICONDUCTOR PACKAGING PROCESS USING THROUGH SILICON VIAS

(75) Inventors: Belgacem Haba, Saratoga, CA (US); Giles Humpston, Buckinghamshire (GB); Moti Margalit, Zichron Yaaqov (IL)

(73) Assignee: Invensas Corp., San Jose, CA (US)

( * ) Notice: Subject to any disclaimer, the term of this patent is extended or adjusted under 35 U.S.C. 154(b) by 0 days.

(21) Appl. No.: 13/488,930

(22) Filed: Jun. 5, 2012

(65) Prior Publication Data

US 2012/0241976 A1 Sep. 27, 2012

Related U.S. Application Data

(62) Division of application No. 12/221,204, filed on Jul. 31, 2008, now Pat. No. 8,193,615.

(60) Provisional application No. 60/962,752, filed on Jul. 31, 2007.

(51) Int. Cl.
*H01L 21/441* (2006.01)

(52) U.S. Cl.
USPC ............... 438/667; 438/613; 257/E21.597

(58) Field of Classification Search
USPC ....................................................... 257/621
See application file for complete search history.

(56) References Cited

U.S. PATENT DOCUMENTS

| | | |
|---|---|---|
| 4,074,342 A | 2/1978 | Honn et al. |
| 4,682,074 A | 7/1987 | Hoeberechts et al. |
| 4,765,864 A | 8/1988 | Holland et al. |
| 5,229,647 A | 7/1993 | Gnadinger |
| 5,322,816 A | 6/1994 | Pinter |
| 5,481,133 A | 1/1996 | Hsu |
| 5,686,762 A | 11/1997 | Langley |
| 5,700,735 A | 12/1997 | Shiue et al. |
| 5,703,408 A | 12/1997 | Ming-Tsung et al. |
| 5,808,874 A | 9/1998 | Smith |
| 6,005,466 A | 12/1999 | Pedder |
| 6,013,948 A | 1/2000 | Akram et al. |
| 6,022,758 A | 2/2000 | Badehi |
| 6,031,274 A | 2/2000 | Muramatsu et al. |

(Continued)

FOREIGN PATENT DOCUMENTS

| | | |
|---|---|---|
| CN | 1490875 A | 4/2004 |
| CN | 1758430 A | 4/2006 |

(Continued)

OTHER PUBLICATIONS

U.S. Appl. No. 12/143,743, "Recontituted Wafer Level Stacking", filed Jun. 20, 2008.

(Continued)

*Primary Examiner* — Stephen W Smoot
(74) *Attorney, Agent, or Firm* — Lerner, David, Littenberg, Krumholz & Mentlik, LLP

(57) ABSTRACT

A microelectronic unit can include a semiconductor element having a front surface, a microelectronic semiconductor device adjacent to the front surface, contacts at the front surface and a rear surface remote from the front surface. The semiconductor element can have through holes extending from the rear surface through the semiconductor element and through the contacts. A dielectric layer can line the through holes. A conductive layer may overlie the dielectric layer within the through holes. The conductive layer can conductively interconnect the contacts with unit contacts.

16 Claims, 15 Drawing Sheets

(56) References Cited

U.S. PATENT DOCUMENTS

| | | |
|---|---|---|
| 6,037,668 A | 3/2000 | Cave et al. |
| 6,103,552 A | 8/2000 | Lin |
| 6,143,369 A | 11/2000 | Sugawa et al. |
| 6,143,396 A | 11/2000 | Saran et al. |
| 6,169,319 B1 | 1/2001 | Malinovich et al. |
| 6,181,016 B1 | 1/2001 | Lin et al. |
| 6,261,865 B1 | 7/2001 | Akram |
| 6,277,669 B1 | 8/2001 | Kung et al. |
| 6,284,563 B1 | 9/2001 | Fjelstad |
| 6,313,024 B1 | 11/2001 | Cave et al. |
| 6,313,540 B1 | 11/2001 | Kida et al. |
| 6,362,529 B1 | 3/2002 | Sumikawa et al. |
| 6,368,410 B1 | 4/2002 | Gorczyca et al. |
| 6,399,892 B1 | 6/2002 | Milkovich et al. |
| 6,472,247 B1 | 10/2002 | Andoh et al. |
| 6,492,201 B1 | 12/2002 | Haba |
| 6,498,381 B2 | 12/2002 | Halahan et al. |
| 6,498,387 B1 | 12/2002 | Yang |
| 6,507,113 B1 | 1/2003 | Fillion et al. |
| 6,586,955 B2 | 7/2003 | Fjelstad et al. |
| 6,608,377 B2 | 8/2003 | Chang et al. |
| 6,638,352 B2 | 10/2003 | Satsu et al. |
| 6,693,358 B2 | 2/2004 | Yamada et al. |
| 6,716,737 B2 | 4/2004 | Plas et al. |
| 6,727,576 B2 | 4/2004 | Hedler et al. |
| 6,737,300 B2 | 5/2004 | Ding et al. |
| 6,743,660 B2 | 6/2004 | Lee et al. |
| 6,812,549 B2 | 11/2004 | Umetsu et al. |
| 6,828,175 B2 | 12/2004 | Wood et al. |
| 6,864,172 B2 | 3/2005 | Noma et al. |
| 6,867,123 B2 | 3/2005 | Katagiri et al. |
| 6,873,054 B2 | 3/2005 | Miyazawa et al. |
| 6,879,049 B1 | 4/2005 | Yamamoto et al. |
| 6,914,336 B2 | 7/2005 | Matsuki et al. |
| 6,927,156 B2 | 8/2005 | Mathew |
| 6,982,475 B1 | 1/2006 | MacIntyre |
| 7,026,175 B2 | 4/2006 | Li et al. |
| 7,068,139 B2 | 6/2006 | Harris et al. |
| 7,091,062 B2 | 8/2006 | Geyer |
| 7,112,874 B2 | 9/2006 | Atlas |
| 7,271,033 B2 | 9/2007 | Lin et al. |
| 7,329,563 B2 | 2/2008 | Lo et al. |
| 7,413,929 B2 | 8/2008 | Lee et al. |
| 7,420,257 B2 | 9/2008 | Shibayama |
| 7,436,069 B2 | 10/2008 | Matsui |
| 7,446,036 B1 | 11/2008 | Bolom et al. |
| 7,456,479 B2 | 11/2008 | Lan |
| 7,531,445 B2 | 5/2009 | Shiv |
| 7,531,453 B2 | 5/2009 | Kirby et al. |
| 7,719,121 B2 | 5/2010 | Humpston et al. |
| 7,750,487 B2 | 7/2010 | Muthukumar et al. |
| 7,754,531 B2 | 7/2010 | Tay et al. |
| 7,767,497 B2 | 8/2010 | Haba |
| 7,781,781 B2 | 8/2010 | Adkisson et al. |
| 7,791,199 B2 | 9/2010 | Grinman et al. |
| 7,807,508 B2 | 10/2010 | Oganesian et al. |
| 7,829,976 B2 | 11/2010 | Kirby et al. |
| 7,901,989 B2 | 3/2011 | Haba et al. |
| 7,915,710 B2 | 3/2011 | Lee et al. |
| 7,935,568 B2 | 5/2011 | Oganesian et al. |
| 8,008,121 B2 | 8/2011 | Choi et al. |
| 8,008,192 B2 | 8/2011 | Sulfridge |
| 8,193,615 B2 * | 6/2012 | Haba et al. .................... 257/621 |
| 8,253,244 B2 | 8/2012 | Kang |
| 8,263,434 B2 | 9/2012 | Pagaila et al. |
| 8,299,608 B2 | 10/2012 | Bartley et al. |
| 8,310,036 B2 | 11/2012 | Haba et al. |
| 8,405,196 B2 | 3/2013 | Haba et al. |
| 8,421,193 B2 | 4/2013 | Huang |
| 2001/0048591 A1 | 12/2001 | Fjelstad et al. |
| 2002/0061723 A1 | 5/2002 | Duescher |
| 2002/0096787 A1 | 7/2002 | Fjelstad |
| 2002/0109236 A1 | 8/2002 | Kim et al. |
| 2002/0151171 A1 | 10/2002 | Furusawa |
| 2003/0059976 A1 | 3/2003 | Nathan et al. |
| 2003/0071331 A1 | 4/2003 | Yamaguchi et al. |
| 2003/0178714 A1 | 9/2003 | Sakoda et al. |
| 2004/0016942 A1 | 1/2004 | Miyazawa et al. |
| 2004/0017012 A1 | 1/2004 | Yamada et al. |
| 2004/0043607 A1 | 3/2004 | Farnworth et al. |
| 2004/0051173 A1 | 3/2004 | Koh et al. |
| 2004/0061238 A1 | 4/2004 | Sekine |
| 2004/0104454 A1 | 6/2004 | Takaoka et al. |
| 2004/0155354 A1 | 8/2004 | Hanaoka et al. |
| 2004/0173891 A1 | 9/2004 | Imai et al. |
| 2004/0178495 A1 | 9/2004 | Yean et al. |
| 2004/0188819 A1 | 9/2004 | Farnworth et al. |
| 2004/0188822 A1 | 9/2004 | Hara |
| 2004/0217483 A1 | 11/2004 | Hedler et al. |
| 2004/0222508 A1 | 11/2004 | Aoyagi |
| 2004/0251525 A1 | 12/2004 | Zilber et al. |
| 2004/0259292 A1 | 12/2004 | Beyne et al. |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0099259 A1 | 5/2005 | Harris et al. |
| 2005/0106845 A1 | 5/2005 | Halahan et al. |
| 2005/0148160 A1 | 7/2005 | Farnworth et al. |
| 2005/0156330 A1 | 7/2005 | Harris |
| 2005/0181540 A1 | 8/2005 | Farnworth et al. |
| 2005/0248002 A1 | 11/2005 | Newman et al. |
| 2005/0260794 A1 | 11/2005 | Lo et al. |
| 2005/0279916 A1 | 12/2005 | Kang et al. |
| 2005/0282374 A1 | 12/2005 | Hwang et al. |
| 2005/0287783 A1 | 12/2005 | Kirby et al. |
| 2006/0001174 A1 | 1/2006 | Matsui |
| 2006/0001179 A1 | 1/2006 | Fukase et al. |
| 2006/0017161 A1 | 1/2006 | Chung et al. |
| 2006/0043598 A1 | 3/2006 | Kirby et al. |
| 2006/0046348 A1 | 3/2006 | Kang |
| 2006/0046463 A1 | 3/2006 | Watkins et al. |
| 2006/0046471 A1 | 3/2006 | Kirby et al. |
| 2006/0055050 A1 | 3/2006 | Numata et al. |
| 2006/0068580 A1 | 3/2006 | Dotta |
| 2006/0071347 A1 | 4/2006 | Dotta |
| 2006/0076019 A1 | 4/2006 | Ho |
| 2006/0079019 A1 | 4/2006 | Kim |
| 2006/0094231 A1 | 5/2006 | Lane et al. |
| 2006/0115932 A1 | 6/2006 | Farnworth et al. |
| 2006/0154446 A1 | 7/2006 | Wood et al. |
| 2006/0175697 A1 | 8/2006 | Kurosawa et al. |
| 2006/0197216 A1 | 9/2006 | Yee |
| 2006/0197217 A1 | 9/2006 | Yee |
| 2006/0264029 A1 | 11/2006 | Heck et al. |
| 2006/0278898 A1 | 12/2006 | Shibayama |
| 2006/0278997 A1 | 12/2006 | Gibson et al. |
| 2006/0292866 A1 | 12/2006 | Borwick et al. |
| 2007/0035020 A1 | 2/2007 | Umemoto |
| 2007/0045779 A1 * | 3/2007 | Hiatt ............................ 257/621 |
| 2007/0052050 A1 | 3/2007 | Dierickx |
| 2007/0096295 A1 | 5/2007 | Burtzlaff et al. |
| 2007/0126085 A1 | 6/2007 | Kawano et al. |
| 2007/0194427 A1 | 8/2007 | Choi et al. |
| 2007/0231966 A1 | 10/2007 | Egawa |
| 2007/0249095 A1 | 10/2007 | Song et al. |
| 2007/0262464 A1 | 11/2007 | Watkins et al. |
| 2007/0269931 A1 | 11/2007 | Chung et al. |
| 2007/0290300 A1 | 12/2007 | Kawakami |
| 2008/0002460 A1 | 1/2008 | Tuckerman et al. |
| 2008/0020898 A1 | 1/2008 | Pyles et al. |
| 2008/0032448 A1 | 2/2008 | Simon et al. |
| 2008/0076195 A1 | 3/2008 | Shiv |
| 2008/0079779 A1 | 4/2008 | Cornell et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0111213 A1 | 5/2008 | Akram et al. |
| 2008/0116544 A1 | 5/2008 | Grinman et al. |
| 2008/0136038 A1 | 6/2008 | Savastiouk et al. |
| 2008/0150089 A1 | 6/2008 | Kwon et al. |
| 2008/0157273 A1 | 7/2008 | Giraudin et al. |
| 2008/0164574 A1 | 7/2008 | Savastiouk et al. |
| 2008/0185719 A1 | 8/2008 | Cablao et al. |

(56) References Cited

U.S. PATENT DOCUMENTS

| | | |
|---|---|---|
| 2008/0230923 A1 | 9/2008 | Jo et al. |
| 2008/0246136 A1 | 10/2008 | Haba et al. |
| 2008/0274589 A1 | 11/2008 | Lee et al. |
| 2008/0284041 A1 | 11/2008 | Jang et al. |
| 2009/0008747 A1 | 1/2009 | Hoshino et al. |
| 2009/0014843 A1 | 1/2009 | Kawashita et al. |
| 2009/0026566 A1 | 1/2009 | Oliver et al. |
| 2009/0032951 A1 | 2/2009 | Andry et al. |
| 2009/0032966 A1 | 2/2009 | Lee et al. |
| 2009/0039491 A1 | 2/2009 | Kim et al. |
| 2009/0045504 A1 | 2/2009 | Suh |
| 2009/0065907 A1 | 3/2009 | Haba et al. |
| 2009/0085208 A1 | 4/2009 | Uchida |
| 2009/0133254 A1 | 5/2009 | Kubota et al. |
| 2009/0134498 A1 | 5/2009 | Ikeda et al. |
| 2009/0212381 A1 | 8/2009 | Crisp et al. |
| 2009/0224372 A1 | 9/2009 | Johnson |
| 2009/0243047 A1 | 10/2009 | Wolter et al. |
| 2009/0263214 A1 | 10/2009 | Lee et al. |
| 2009/0267183 A1 | 10/2009 | Temple et al. |
| 2009/0267194 A1 | 10/2009 | Chen |
| 2009/0283662 A1 | 11/2009 | Wu et al. |
| 2009/0294983 A1 | 12/2009 | Cobbley et al. |
| 2009/0309235 A1 | 12/2009 | Suthiwongsunthorn et al. |
| 2010/0013060 A1 | 1/2010 | Lamy et al. |
| 2010/0038778 A1 | 2/2010 | Lee et al. |
| 2010/0117242 A1 | 5/2010 | Miller et al. |
| 2010/0127346 A1 | 5/2010 | DeNatale et al. |
| 2010/0148371 A1 | 6/2010 | Kaskoun et al. |
| 2010/0155940 A1 | 6/2010 | Kawashita et al. |
| 2010/0159699 A1 | 6/2010 | Takahashi |
| 2010/0164062 A1 | 7/2010 | Wang et al. |
| 2010/0167534 A1 | 7/2010 | Iwata |
| 2010/0193964 A1 | 8/2010 | Farooq et al. |
| 2010/0225006 A1 | 9/2010 | Haba et al. |
| 2010/0230795 A1 | 9/2010 | Kriman et al. |
| 2010/0258917 A1 | 10/2010 | Lin |
| 2011/0089573 A1 | 4/2011 | Kurita |
| 2012/0018863 A1 | 1/2012 | Oganesian et al. |
| 2012/0018868 A1 | 1/2012 | Oganesian et al. |
| 2012/0018893 A1 | 1/2012 | Oganesian et al. |
| 2012/0018894 A1 | 1/2012 | Oganesian et al. |
| 2012/0018895 A1 | 1/2012 | Oganesian et al. |
| 2012/0068330 A1 | 3/2012 | Oganesian et al. |
| 2012/0068352 A1 | 3/2012 | Oganesian et al. |

FOREIGN PATENT DOCUMENTS

| | | |
|---|---|---|
| CN | 101675516 A | 3/2010 |
| EP | 0316799 A1 | 5/1989 |
| EP | 0926723 A1 | 6/1999 |
| EP | 1482553 A2 | 12/2004 |
| EP | 1519410 A1 | 3/2005 |
| EP | 1551060 A1 | 7/2005 |
| EP | 1619722 A1 | 1/2006 |
| EP | 1653510 A2 | 5/2006 |
| EP | 1653521 A1 | 5/2006 |
| EP | 1686627 A1 | 8/2006 |
| JP | 60160645 A | 8/1985 |
| JP | 1106949 A | 4/1989 |
| JP | 4365558 A | 12/1992 |
| JP | 08-213427 A | 8/1996 |
| JP | 11016949 A | 1/1999 |
| JP | 11195706 A | 7/1999 |
| JP | 2001085559 A | 3/2001 |
| JP | 2001-217386 A | 8/2001 |
| JP | 2002016178 A | 1/2002 |
| JP | 2002162212 A | 6/2002 |
| JP | 2002217331 A | 8/2002 |
| JP | 2002373957 A | 12/2002 |
| JP | 2003318178 A | 11/2003 |
| JP | 2004165602 A | 6/2004 |
| JP | 2004200547 A | 7/2004 |
| JP | 2005026405 A | 1/2005 |
| JP | 2005093486 A | 4/2005 |
| JP | 2005101268 A | 4/2005 |
| JP | 2005209967 A | 8/2005 |
| JP | 2005216921 A | 8/2005 |
| JP | 2007053149 A | 3/2007 |
| JP | 2007157844 A | 6/2007 |
| JP | 2007317887 A | 12/2007 |
| JP | 2008-091632 A | 4/2008 |
| JP | 2008-177249 A | 7/2008 |
| JP | 2008227335 A | 9/2008 |
| JP | 2008-258258 A | 10/2008 |
| JP | 2010-028601 A | 2/2010 |
| KR | 19990088037 | 12/1999 |
| KR | 20040066018 A | 7/2004 |
| KR | 20060009407 A | 1/2006 |
| KR | 2006-0020822 A | 3/2006 |
| KR | 20070065241 A | 6/2007 |
| KR | 100750741 B1 | 8/2007 |
| KR | 20100087566 A | 8/2010 |
| TW | 200406884 A | 5/2004 |
| TW | 200522274 A | 7/2005 |
| TW | 200535435 A | 11/2005 |
| TW | 201025501 A | 7/2010 |
| WO | 03/025998 A2 | 3/2003 |
| WO | 2004114397 | 12/2004 |
| WO | 2008/054660 A2 | 5/2008 |
| WO | 2008108970 A2 | 9/2008 |
| WO | 2009017758 A2 | 2/2009 |
| WO | 2009023462 A1 | 2/2009 |
| WO | 2009104668 A1 | 8/2009 |
| WO | 2010104637 A1 | 9/2010 |

OTHER PUBLICATIONS

U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report and Written Opinion, PCT/US2008/009356 dated Feb. 19, 2009.
Partial International Search Report, PCT/US2008/002659.
International Search Report, PCT/US2008/002659, Oct. 17, 2008.
U.S. Appl. No. 12/784,841, filed May 21, 2010.
U.S. Appl. No. 12/842,717, filed Jul. 23, 2010.
U.S. Appl. No. 12/842,612, filed Jul. 23, 2010.
U.S. Appl. No. 12/842,651, filed Jul. 23, 2010.
U.S. Appl. No. 12/723,039, filed Mar. 12, 2010.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report and Written Opinion, PCT/US2010/052785, Dated Dec. 20, 2010.
International Search Report and Written Opinion for PCT/US2011/051552 dated Apr. 11, 2012.
International Search Report and Written Opinion for PCT/US2011/051556 dated Feb. 13, 2012.
International Searching Authority, Search Report for Application No. PCT/US2011/060553 dated Jun. 27, 2012.
Taiwan Office Action for Application No. 100113585 dated Jun. 5, 2012.
International Search Report and Written Opinion for Application No. PCT/US2011/029394 dated Jun. 6, 2012.
Partial International Search Report for Application No. PCT/US2011/063653 dated Jul. 9, 2012.
International Search Report and Written Opinion for Application No. PCT/US2011/063653 dated Aug. 13, 2012.
Japanese Office Action for Application No. 2009-552696 dated Aug. 14, 2012.
David R. Lide et al: 'Handbook of Chemistry and Physics, 77th Edition, 1996-1997', Jan. 1, 1997, CRC Press, Boca Raton, New York, London, Tokyo, XP002670569, pp. 12-90-12-91.
International Search Report and Written Opinion for Application No. PCT/US2011/060553 dated Oct. 26, 2012.

(56) References Cited

OTHER PUBLICATIONS

International Search Report and Written Opinion, PCT/US2011/063025, Mar. 19, 2012.
International Search Report Application No. PCT/US2011/029568, dated Aug. 30, 2011.
International Search Report Application No. PCT/US2011/029568, dated Oct. 21, 2011.
International Written Opinion for Application No. PCT/US2011/063653 dated Jan. 14, 2013.
Japanese Office Action for Application No. 2010-519953 dated Oct. 19, 2012.
Chinese Office Action for Application No. 201010546210.2 dated Aug. 21, 2013.
Chinese Office Action for Application No. 201010546793.9 dated Jun. 25, 2013.
Japanese Office Action for Application No. 2009-552696 dated Nov. 1, 2013.
Preliminary Examination Report from Taiwan Application No. 099140226 dated Oct. 21, 2013.
Taiwanese Office Action for Application No. 099143374 dated Jun. 24, 2013.
Taiwanese Office Action for Application No. 100133520 dated Dec. 12, 2013.

\* cited by examiner

SEMICONDUCTOR PACKAGING PROCESS USING THROUGH SILICON VIAS

CROSS-REFERENCE TO RELATED APPLICATIONS

The present application is a divisional of U.S. Pat. No. 8,193,615, filed Jul. 31, 2008, and claims the benefit of the filing date of U.S. Provisional Patent Application No. 60/962,752, filed Jul. 31, 2007, the disclosures of which are hereby incorporated by reference herein.

BACKGROUND OF THE INVENTION

Microelectronic devices generally comprise a thin slab of a semiconductor material, such as silicon or gallium arsenide, commonly called a die or a semiconductor chip. In one face of the die is fabricated the active circuitry. To facilitate electrical connection to the active circuitry, the die is provided with bond pads on the same face. The bond pads are typically placed in a regular array either around the edges of the die or, for many memory devices, in the die center. The bond pads are generally made of a conductive metal, such as gold or aluminium, around 0.5 μm thick. The size of the bond pads will vary with the device type but will typically measure tens to hundreds of microns on a side.

Wire bonding and flip-chip interconnection are two schemes used for making contact to the die bond pads. In wire bonding, the die is attached to a substrate in a face-upwards orientation and fine wire is connected to each bond pad by a solid state joining method such as ultrasonic welding or thermo-compression diffusion bonding. In flip-chip interconnection, lumps of metal are placed on each bond pad. The die is then inverted so the metal lumps provide both the electrical pathway between the bond pads and the substrate as well as the mechanical attachment of the die to the substrate. There are many variations of the flip-chip process, but one common configuration is to use solder for the lumps of metal and fusion of the solder as the method of fastening it to the bond pads and the substrate. When it melts the solder flows to form truncated spheres. Depending on the dimensions of the solder sphere this is referred to as a ball grid array (BGA) interface or a micro ball grid array (μBGA) interface.

Semiconductor devices used as image sensors usually require a face-up orientation such that the scene of interest can be focused (or projected) on the active circuitry. For commercial reasons, it is often desirable that the die are connected to the substrate using a BGA or μBGA interface.

One approach to connect the die bond pads on the front face of the die to a BGA interface on the rear face of the die is to provide wiring traces that extends from the die bond pads over the front face of the die, down the sides of the die and onto the rear face of the die. This type of lead contact is often referred to as a "T-style contact" because the wiring trace on the edge of the die and the wiring trace on the front face of the die appears to form a "T" where they join. FIGS. 2a and 2b illustrate an example of a T-style contact.

FIG. 2a shows a schematic frontal 200 view and FIG. 2b a cross-sectional view 250 of a single T-style contact of a semiconductor package. The die is drawn upside down so the front face 201/251 is towards the bottom of the page and the rear face 202/252 towards the top of the page. A bond pad 203/253 on the front face connects to the wiring trace 204/254 on the edge of the die. The wiring trace continues to a land 205/255 on the rear face, where it joins to a solder sphere 206/256. The shape of the T-style contact 257 is evident in the cross-sectional view, while the sidewall angle 207 is indicated in the frontal view. The drawing is not to scale.

An alternative approach for an image sensor package is to use through silicon vias (TSV) to connect the bond pads to the BGA interface. FIG. 3 is a cross-section view 300 of a typical TSV. The TSV is a hole (or blind via) extending through the thickness of the semiconductor that terminates on the underside of a bond pad 304. The sides or wall of the through hole are coated with metal to form an electrically conductive pathway between the front and rear surfaces of the die. A deep reactive ion etching process known in the engineering community as the 'Bosch process' may be used to form the TSV shown in FIG. 3. The contact to the bond pad 304 shown in FIG. 3 is often described as U-style. To complete the electrical circuit between the underside of the die bond pads and the conductive coating applied to the walls of TSVs requires a solid state bond between the two metals.

FIG. 3 shows the semiconductor die inverted with a front face 301 and a rear face 302. A hole 310 extends through the thickness of the die and the dielectric film 303 underneath the bond pad 304 to terminate on the bond pad 304. A dielectric material 311 and a conductive coating 312 line the walls of the hole. Both the dielectric material lining the through hole 310 and the conductive coating 312 extend on to an area of the rear face 302 of the die. Hole 310 extending through the silicon is parallel-sided and perpendicular to the die faces 301 and 302.

SUMMARY OF THE INVENTION

In an embodiment of the present invention, a microelectronic unit can include a semiconductor element having a front surface, a microelectronic semiconductor device adjacent to the front surface, contacts at the front surface and a rear surface remote from the front surface. The semiconductor element can have through holes extending from the rear surface through the semiconductor element and through the contacts. A dielectric layer can line the through holes. A conductive layer may overlie the dielectric layer within the through holes. The conductive layer can conductively interconnect the contacts with unit contacts.

In another embodiment of the invention, a microelectronic unit can include a semiconductor element having a front surface, a plurality of contacts at the front surface and a rear surface remote from the front surface. The rear surface can include at least one recess. A plurality of through holes can extend from the recess through the semiconductor element and through the contacts. Conductive vias within the through holes can interconnect the contacts with conductors within the at least one recess.

In still another embodiment of the present invention, a microelectronic unit can include a plurality of semiconductor elements stacked and joined together. Each semiconductor element can have a front surface defining a horizontal plane, contacts at the front surface and a rear surface remote from the front surface. The semiconductor elements can be stacked in a vertical direction transverse to the horizontal plane. A plurality of through holes can extend through at least one of the stacked semiconductor elements and through contacts of the at least one semiconductor element. The contacts of the plurality of stacked semiconductor elements can be exposed within the through holes. A dielectric layer can line the through holes and a conductive layer can overlie the dielectric layer within the through holes. The conductive layer can be in conductive communication with unit contacts of the microelectronic unit.

In an embodiment of the present invention, a microelectronic unit can include a semiconductor element having a front surface, contacts at the front surface, a rear surface remote from the front surface, and edges extending between the front and rear surface. A dielectric element can extend outwardly from at least one of the edges of the semiconductor element. The dielectric element can have a front surface and a rear surface remote from the front surface and can include a plurality of conductive pads connected to the contacts. The dielectric element can also include a plurality of through holes extending between the front and rear surfaces and through the plurality of conductive pads. A plurality of unit contacts can be exposed at an exterior of the microelectronic unit. Conductive features can extend from the contacts within the through holes and can be in conductive communication with the unit contacts.

In another embodiment of the present invention, a method of forming a unit contact exposed at a rear face of a microelectronic element can include forming a first through hole extending from a rear face of the microelectronic element towards an element contact at a front face of the microelectronic element. An insulative coating can be formed overlying at least a wall of the first hole. A second hole can be formed to extend through the element contact. The unit contact exposed at the rear face can be formed including a conductive material which can overlie the wall of the first hole and can overlie a wall of the second hole and be conductively connected with the element contact.

In still another embodiment of the present invention, a method of forming a unit contact exposed at a rear face of a microelectronic element can include (a) forming a through hole extending from a rear face of the microelectronic element through an element contact at a front face of the microelectronic element. An insulative layer can be exposed at a wall of the hole. Further, the microelectronic element can include forming the unit contact exposed at the rear face, including a conductive layer overlying the insulative layer and conductively connected with the element contact.

BRIEF DESCRIPTION OF THE DRAWINGS

FIG. 4b is a corresponding plan view further illustrating the semiconductor package shown in FIG. 4a.

FIG. 4c is a sectional view illustrating a variation of the semiconductor package of FIG. 4a.

FIG. 5b is a sectional view illustrating a microelectronic unit according to a variation of the embodiment illustrated in FIG. 5a.

DETAILED DESCRIPTION

As used in this disclosure, a contact "exposed at" a surface of a dielectric element may be flush with such surface; recessed relative to such surface; or protruding from such surface, so long as the contact is accessible by a theoretical point moving towards the surface in a direction perpendicular to the surface. As described, for example in co-pending, commonly assigned U.S. patent application Ser. No. 10/949,674, the disclosure of which is incorporated by reference herein, the through conductors may include elements such as solid metallic spheres, solder connections or other metallic elements. Also, contacts may be disposed at the same locations as the through conductors, or at different locations.

Figure 1:
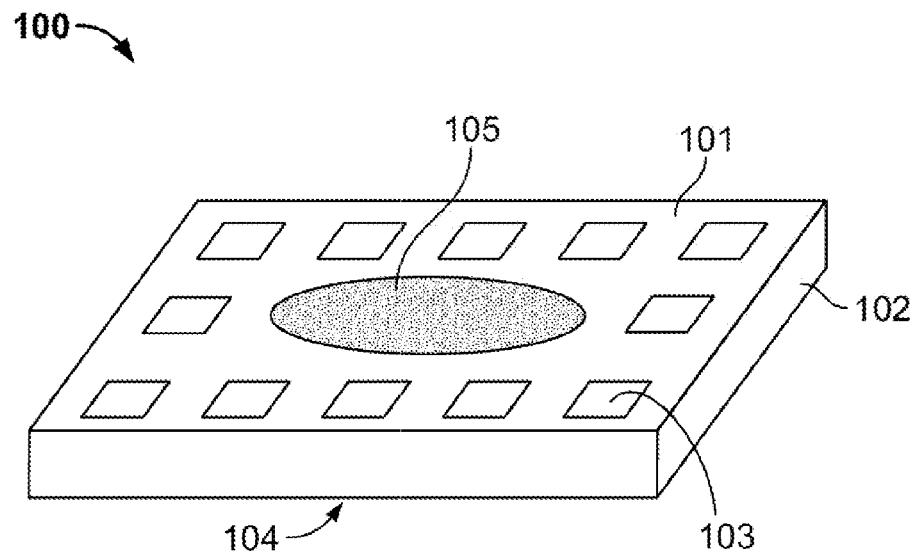
FIG. 1 is a perspective view of a semiconductor die having die bond pads on its periphery.
Figure 2A:
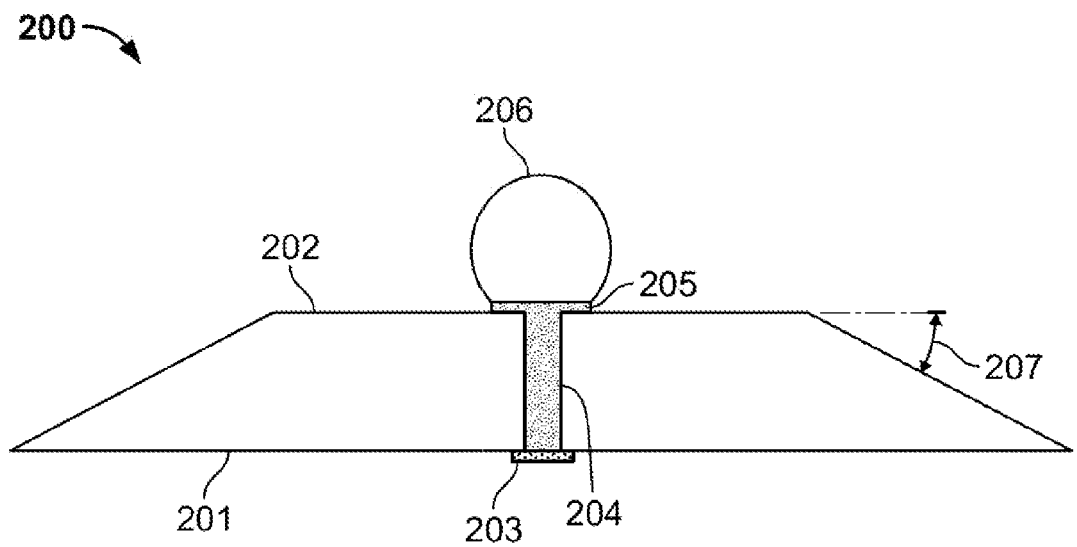
FIG. 2a is a front (elevational) view and FIG. 2b is a sectional view illustrating a conventional chip-scale semiconductor package having a T-style contact.
Figure 2B:
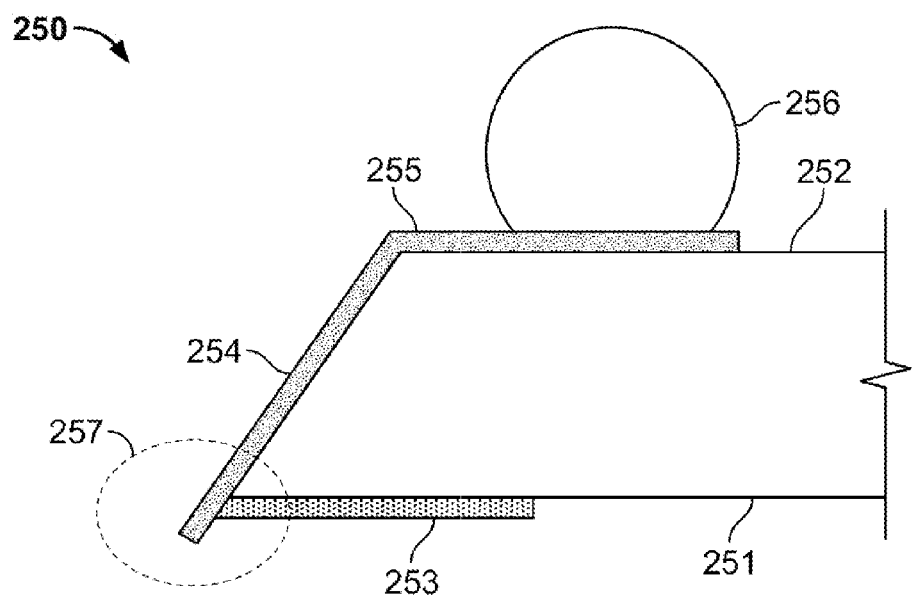
Figure 3:
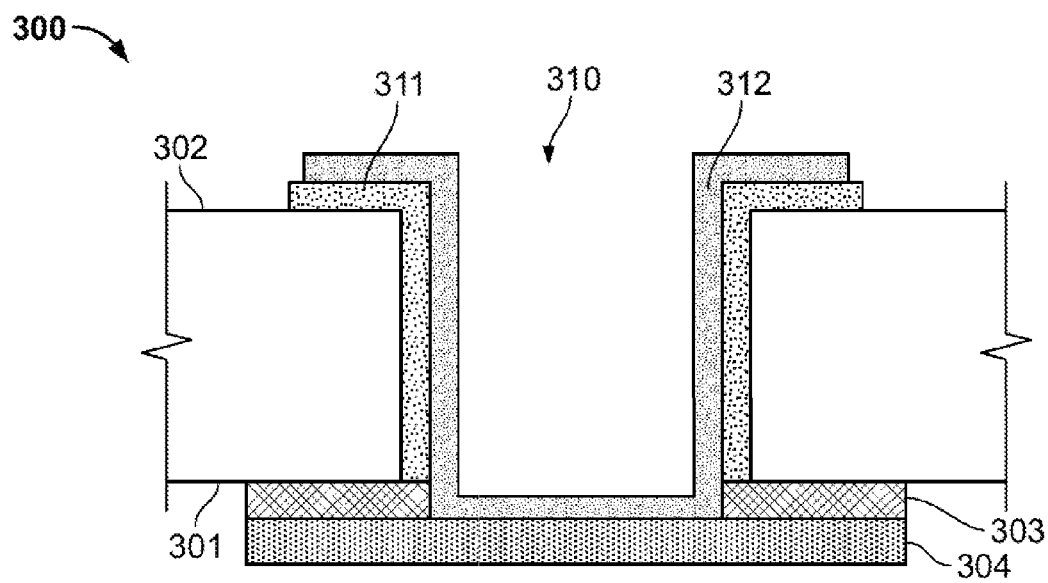
FIG. 3 is a sectional view illustrating a semiconductor package having a through silicon via exposing an underside (inner surface) of a bond pad.

FIG. 1 is a perspective drawing or isometric drawing, not to scale, of a typical semiconductor die 100. The die 100 includes a the front face 101, die edges 102 and bond pads 103 arrayed adjacent the die periphery. Not directly visible, but present by implication, are the rear face 104 of the die and the active circuitry 105 buried just below the surface of the front face 101.

Described below is a form of T-style contact between a wiring trace on the edge of a die or the sidewall of a TSV and a bond pad on the front face of a die. This contact can be used to complete an electrical pathway between the die bond pad and a BGA interface on the opposing face of the die. As will be discussed, this structure also affords the possibility of other interconnect configurations including TSVs fabricated, i.e., etched, starting from the front face of the die and double-sided contacts. Some benefits of various embodiments of the invention include high interconnection density per unit area, simple fabrication processes and pathways through the die thickness offering low electrical resistance.

Figure 4A:
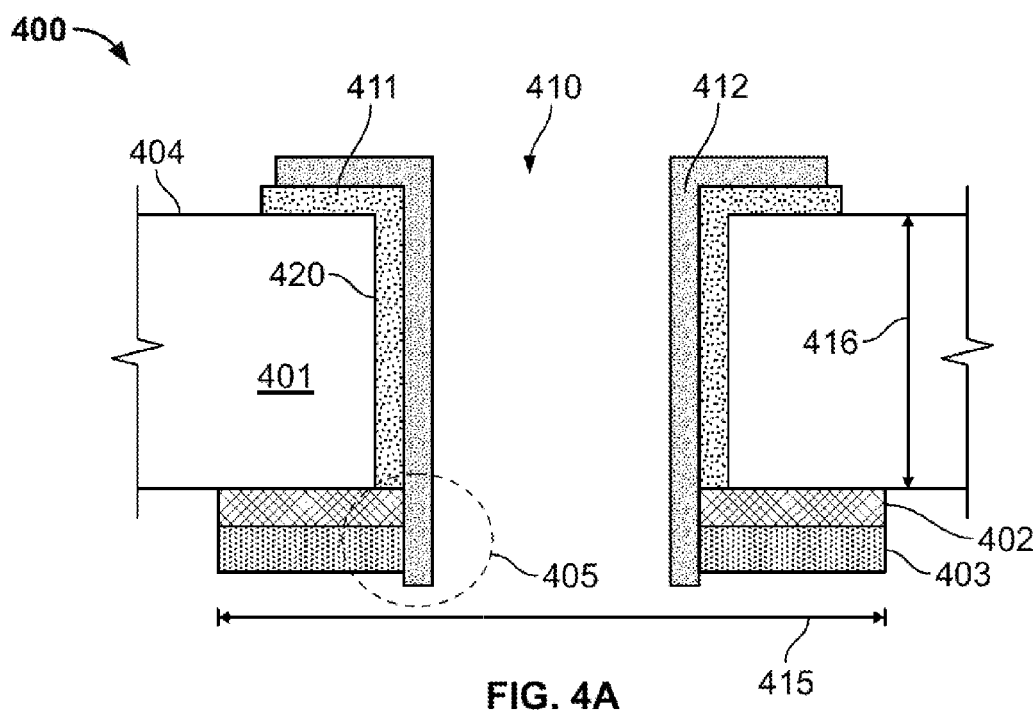
FIG. 4a is a sectional view illustrating a semiconductor package having a through silicon via, according to one embodiment of the invention.
Figure 4B:
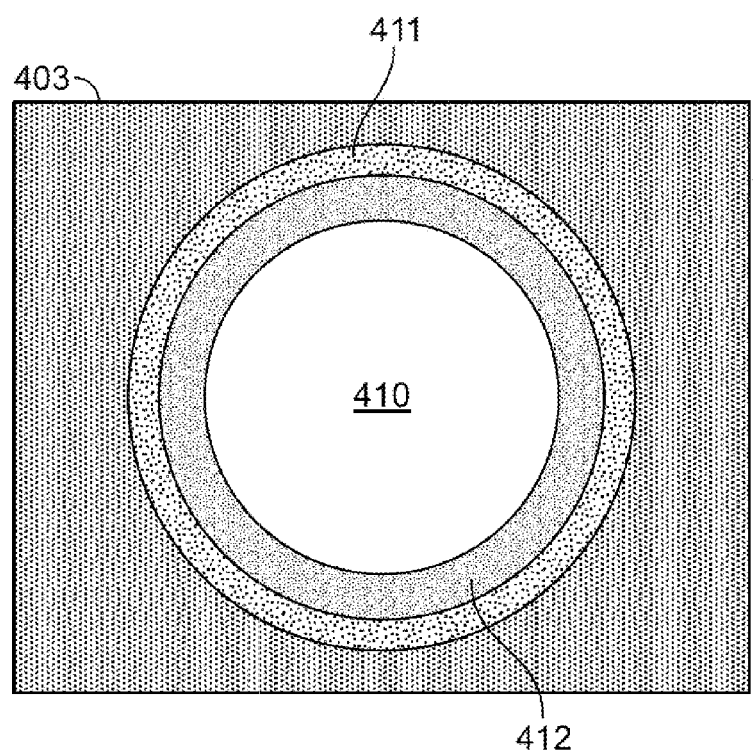

FIGS. 4a and 4b illustrate an example of a TSV that extends through a microelectronic element 400 e.g. a silicon die. FIG. 4a is a cross-section view of a through silicon via TSV formed along a through hole 410 that extends completely through the entire thickness of a semiconductor die. This includes a semiconductor material region 401 of the die, the bond pad 403, and the dielectric film 402 underneath the bond pad 403. A dielectric material, such as an insulative coating, 411 lines a wall 420 of a through hole, extending through the semiconductor region 401. The thickness 416 of the semiconductor region of the die can range from a few tens of microns to several hundred microns. Some semiconductor wafers, for example, have a thickness of 800 microns. A typical bond pad width 415 along the surface (front face) of the die is 100 microns, which typically is the same or similar to the length of the bond pad along the front surface. As illustrated in the plan view of FIG. 4b, the intersection between the bond pad 403 and the hole 410 optionally is contained entirely within the area of the bond pad 403.

A conductor, which may be in the form of a conductive coating 412 as shown in FIG. 4a, contacts edges of the bond pad 403 within the through hole 410 and extends through the hole 410 to the rear face 404. The conductive coating 412 can contact an edge of the bond pad 403 exposed by the through hole 410 to form a T-style contact 405. Both the dielectric material 411 lining wall 420 of the through hole 410 and the conductive coating 412 or other conductor optionally extends onto an area of the rear face 404 of the die.

TSVs having vertical sidewalls may present difficulties in processing. Such TSVs may have high aspect ratios, where the height of each TSV exceeds the diameter of the TSV, sometimes by a factor of two or more. When diameters are small, high aspect ratio TSVs can make vapor deposition processes and electrodeposition processes (e.g., electrophoretic coating and various electroplating processes) more difficult to control.

Figure 4C:
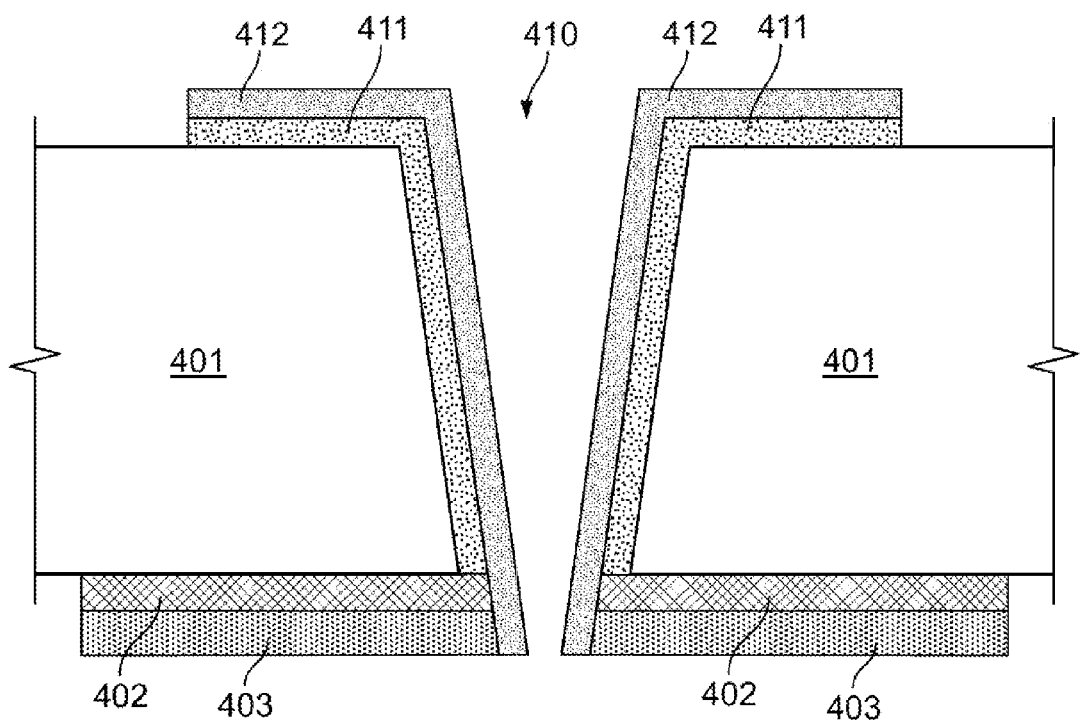

As shown in FIG. 4c, the hole 410 can have a tapered shape such that the size of the hole increases with increasing distance from the front surface. In such case, the diameter of the hole increases with increasing distance from the front face of the die. Such shape provides for a radially symmetric T-style contact. Formation of a hollow hole through the die, that is parallel-sided and perpendicular to the die surfaces is readily accomplished by any machining process that is not material selective. Examples include, mechanical drilling, laser ablation, and certain wet etches and activated plasma chemistries. Of these, laser ablation may be relatively easy to instigate in volume manufacture owing to the combination of the speed of material removal, coupled with the benefits of soft tooling associated with this process.

Because the machining process used to form the hole penetrates the thickness of the bond pad it exposes virgin metal of the bond pad. This means there is no need for scrupulous cleaning post-machining of the hole and prior to application of the conductive coating on a wall of the hole. This simplifies the processing.

Figure 4D:
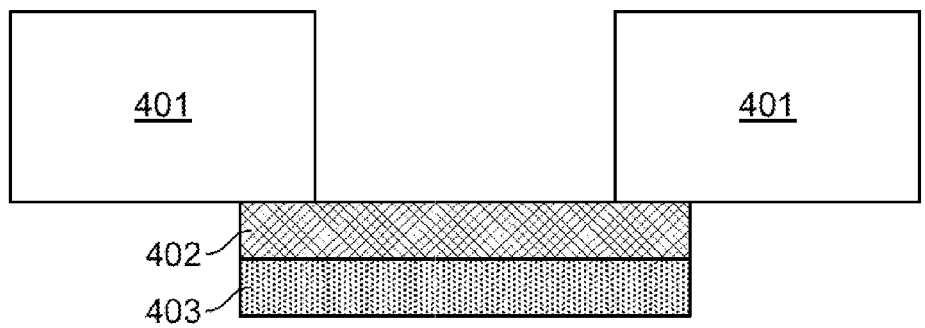
FIGS. 4d-4h are sectional views illustrating stages in a process of forming a conductive via according to one embodiment of the invention.
Figure 4E:
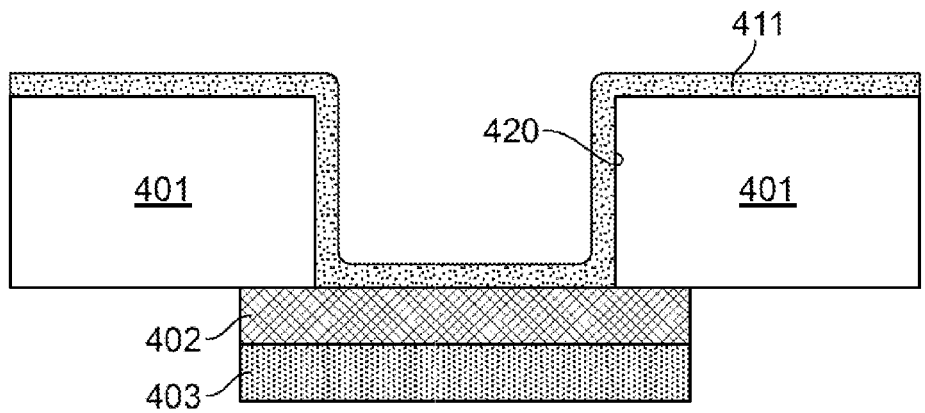
Figure 4F:
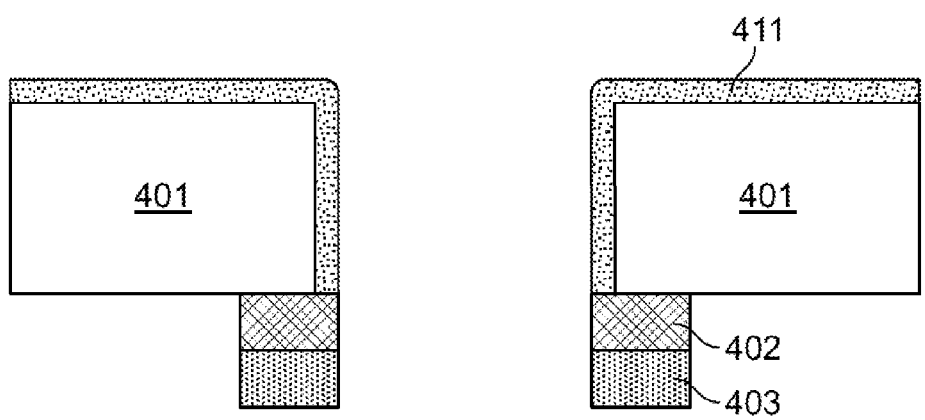

Referring to FIG. 4d, in a particular embodiment, a hole 410 can be etched in a semiconductor region 401 of the microelectronic element to expose a surface of a dielectric layer 402 between the element contact 403 and the semiconductor region. An insulative layer 411, (FIG. 4e) can then be formed which extends along a wall 420 of the hole. Thereafter, as illustrated in FIG. 4f, the hole 410 can be extended through the dielectric layer 402 and the element contact 403. If the insulative layer 411 lines a bottom of the hole when formed, (such as depicted in FIG. 4e) the process of extending the hole may cause the hole to pass through a portion of the insulative layer 411 (FIG. 4f). After extending the hole through the element contact 403, conductive material 412 can then be deposited in contact with the element contact 403 and the insulative layer 411 of the hole, as illustrated in FIG. 4a.

Figure 4G:
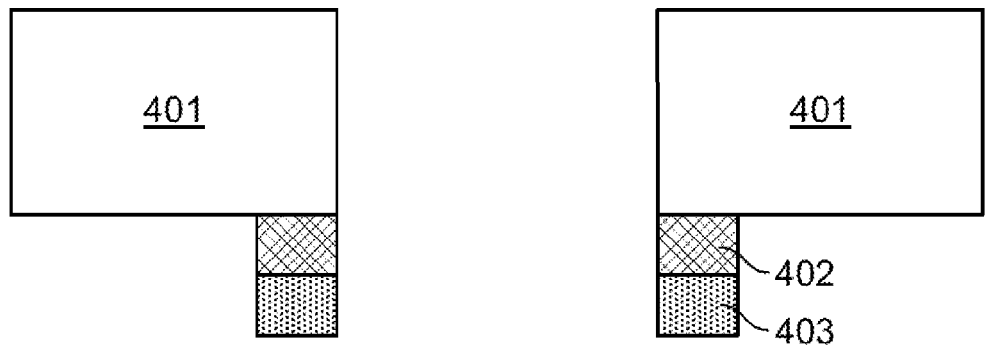
Figure 4H:
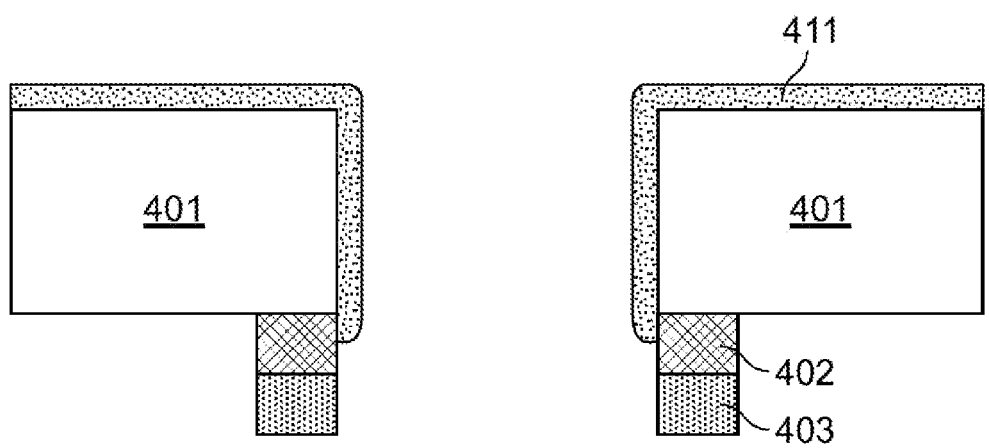

In another embodiment of the present invention, a hole 410 may be formed through the semiconductor region 401, dielectric layer 402 and element contact 403 in a single step, as seen in FIG. 4g. In such instance, the hole may be formed using laser ablation or drilling. Thereafter, an insulative layer 411 may be formed over just the semiconductor region 401, as seen in FIG. 4h. Such an insulative layer may be formed using electrophoretic deposition. Next, conductive material 412 can then be deposited in contact with the element contact 403 and the insulative layer 411 of the hole, as illustrated in FIG. 4a. Such a conductive layer may be formed using chemical vapour deposition, sputtering or physical vapour deposition.

In a variation of the embodiment shown in FIGS. 4a-4c, the conductor may be in the form of a solid conductor which fills the hole, or may be in the form of a conductive coating but extend along only a portion of the wall. In another variation, if the rear face of the die already includes a dielectric layer, the dielectric layer lining the hole need not extend onto the rear face of the die.

Figure 5A:
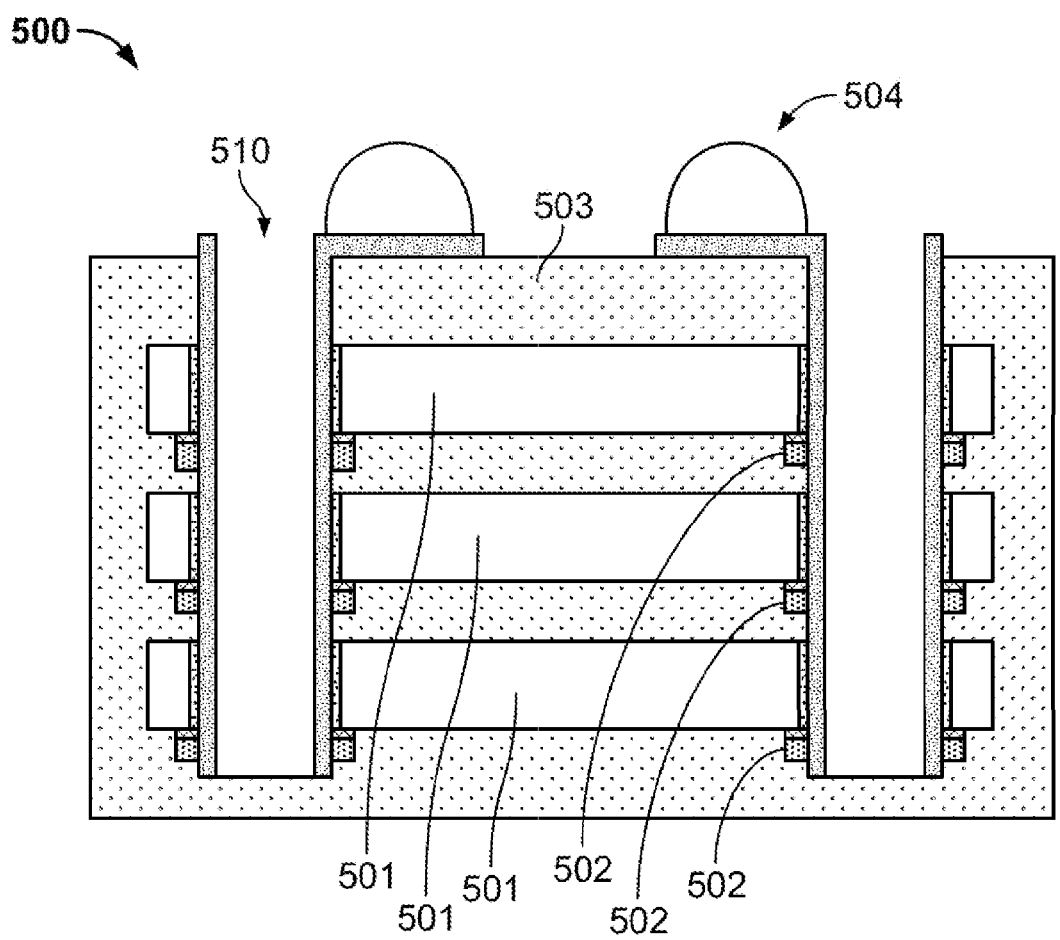
FIG. 5a is a sectional view illustrating a microelectronic unit including a plurality of vertically stacked semiconductor elements, according to one embodiment of the invention.

An advantage of TSVs of the type shown in FIGS. 4a-4c is that the resulting interconnect technology is compatible with stacks of die where bond pads on each layer of die are aligned when viewed in plan (FIG. 5a). A TSV technology that is able to traverse multiple layers of die makes it possible to connect all of these bond pads in parallel in a single process step. A resulting microelectronic unit includes vertically aligned die 501 joined together in a stack, each die having T-style contacts conductively interconnecting the bond pads 502 of each die with unit contacts 504, as illustrated in FIG. 5a.

FIG. 5a shows the principal features of the structure by way of illustration and is not to scale. FIG. 5a is a cross-section drawing through a stack of die 500. In each layer the TSV 510 extends completely through the dies 501 and bond pads 502, so each connection to the bond pad is by a frusto-conical T-style contact. Two additional features are included in this figure by way of completeness. These are the encapsulant 503 that surrounds each die and holds the stack together and the BGA interface 504 on top of the die stack.

Although FIG. 5a illustrates TSVs having vertical and taperless walls, alternative embodiments may not be exactly vertical and taperless, regardless of whether they pass through a single die or stack of die. The TSVs may be both tapered and deviate from the vertical. The only restriction is that the TSV must be smaller in diameter than the bond pads through which it passes, as illustrated in FIG. 4b. This maximizes the length of the T-style contact. Also, a TSV formed partially outside of a bond pad risks damaging circuitry on the die. In accordance with the known art the TSVs may, or may not, be filled with dielectric or conductive material, depending on the electrical characteristics desired of the pathway and which will differ for high power and high frequency applications.

Because the TSV traverses the thickness of the silicon and the bond pad, it will be apparent that the structure can be fabricated by machining from either the front or the rear face of the die. Indeed, should other considerations dictate, it is also possible to machine the TSV from both sides with aligned TSVs meeting within the depth of the die. Following completion of the TSV, it is apparent that the die now has bond pads on the front face coupled to lands in an identical location on the rear face. From the point of view of making electrical connection to the die, it is now effectively a double-sided component so it can be mounted in either the face up or face down orientation. Also, if other electrical or electronic parts are attached to one face of the die, this new form of TSV can be used to convey electrical signals from one side of the die to the other, without interacting with the circuitry on the die, provided the bond pad is a dummy feature with no connection to the die circuitry.

As indicated above, the conductive element of the TSV has to be electrically isolated from the semiconductor through which it passes, otherwise the electrical pathways would all be shorted to each other. This is dielectric layer 411 as shown in FIG. 4. This dielectric layer has to be applied after the machining of the hole, but its application must not extend to the exposed metal of the bond pad that will be used to make the T-style contact. There are a number of processes for forming dielectric films that are compatible with this requirement. One is to create a dielectric layer by oxidation of the exposed semiconductor. This works if the semiconductor is silicon, since silica (silicon oxide) is an insulator. Chemistries exist that will oxidize silicon but leave the metal of the bond pad in a metallic state.

Figure 5B:
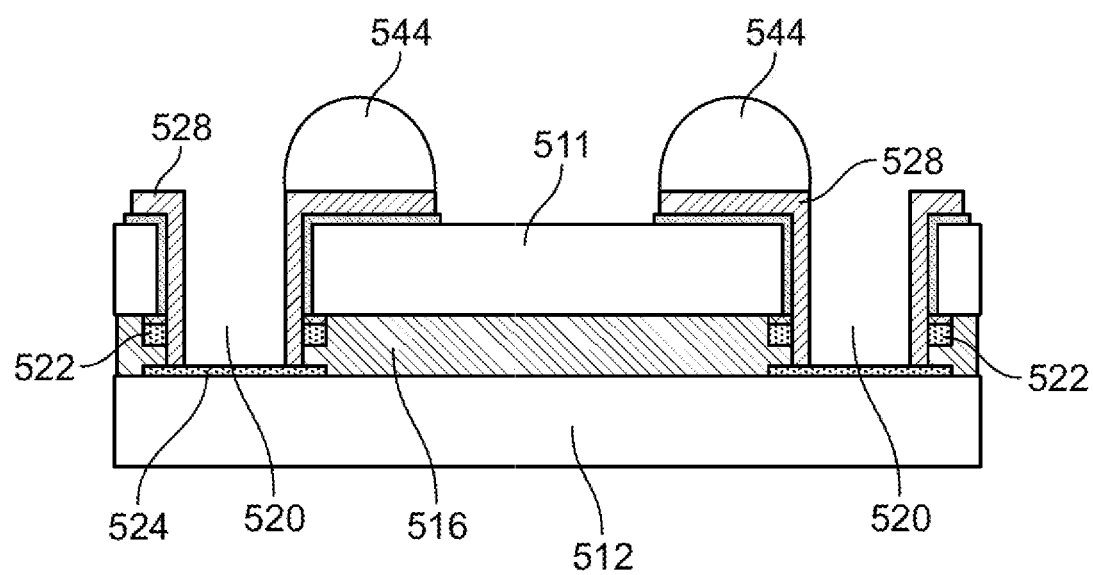

In a variation of the above embodiment, FIG. 5b shows a stacked microelectronic unit in which TSVs 520 extend through a first semiconductor die 511 and bond pads 522 of the first die, the TSVs exposing bond pads 524 at a front face of a second die 512. A dielectric material 516 can be exposed between opposing faces of the two die. A conductive layer 528 conductively interconnects bond pads 522 of the first die, pads 524 of the second die 512 and unit contacts 544 of the unit. In a variation of the embodiment shown in FIG. 5b, instead of a single first die 511, a plurality of first die can be stacked and interconnected with the second die 512 by conductive layers within TSVs.

Figure 6A:
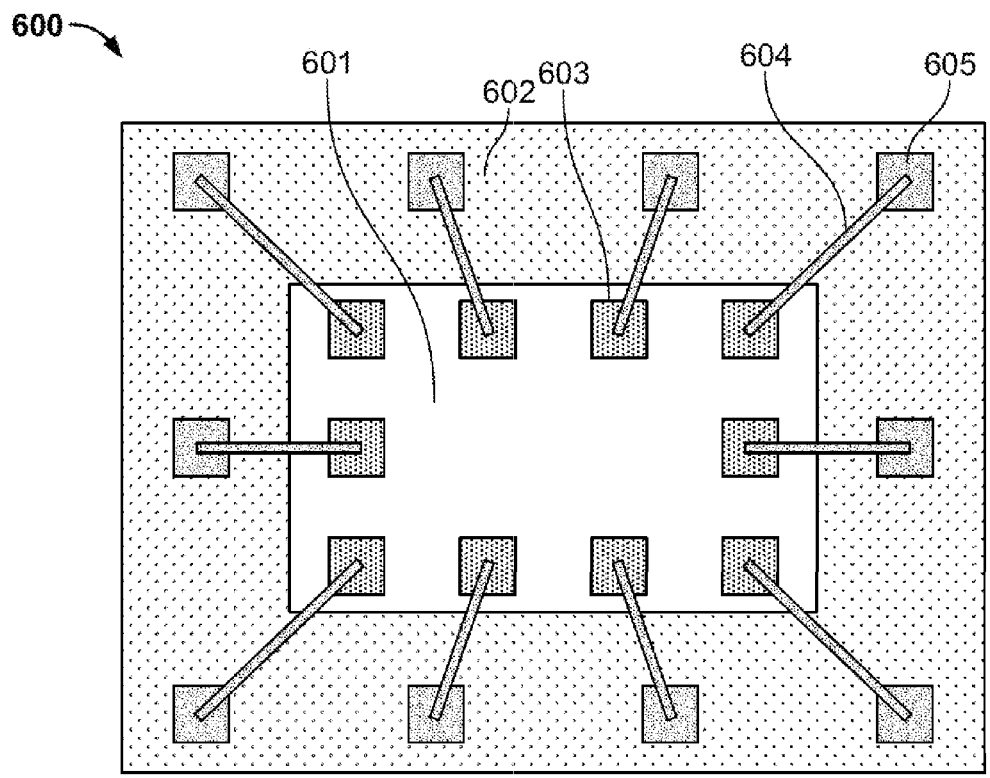
FIG. 6a is a partial plan view illustrating a portion of a reconstituted wafer including a semiconductor element and a dielectric element adjacent to an edge of the semiconductor element, according to one embodiment of the invention.
Figure 6B:
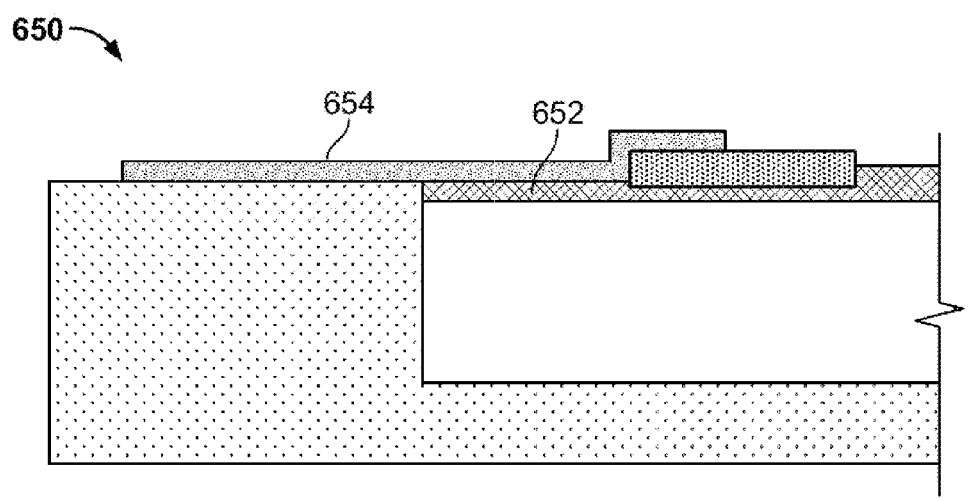
FIG. 6b is a corresponding sectional view illustrating conductive traces extending between the semiconductor element and the dielectric element of the reconstituted wafer shown in FIG. 6a, according to one embodiment of the invention.

FIG. 6a illustrates a die built in a reconstituted wafer according to one embodiment of the invention. The silicon die 601 is surrounded on at least four faces (five if the underside of the die is covered) by a dielectric material 602. The bond pads 603 on the die 601 are connected by a wiring trace 604 to new bond pads 605 on the dielectric material 602. A partial sectional view along one wiring trace is given in FIG. 6b 650. In this figure, it can be seen that the wiring trace 654 is isolated from the semiconductor by a dielectric film 652 that is applied to the die as part of its manufacturing process. The dielectric film 652 does not extend beyond the die periphery because the material used to construct the reconstituted wafer and which surrounds the die, is also dielectric in nature.

In a reconstituted wafer the edges of each die usually are surrounded by dielectric material, such as a solidified liquid polymer, for example, a dielectric overmold composition, as shown in FIG. 6a. The dielectric material may also cover the rear face of each die. The dielectric material 602 does not usually cover the front face of the die 601 but is flush with it. Part of the process of manufacturing the reconstituted wafers is to apply a patterned metal coating to the front face. The function of this wiring trace is to connect the die bond pads to similar pads outside of the die area. These new bond pads are formed of a conductive materials such as metal overlying the dielectric material. For the embodiment shown in FIGS. 6a and 6b, the through vias will be formed which extend through the dielectric material 602 surrounding the die. Consequently, the through vias will not require an additional dielectric film to isolate the conductive coating on the via from the dielectric material through which it passes. A simpler, economical process is achieved particularly when through vias are formed en masse with respect to one or more reconstituted wafers or stack of reconstituted wafers. Reconstituted wafers can be used for both single die applications as well as die stacks.

Figure 7A:
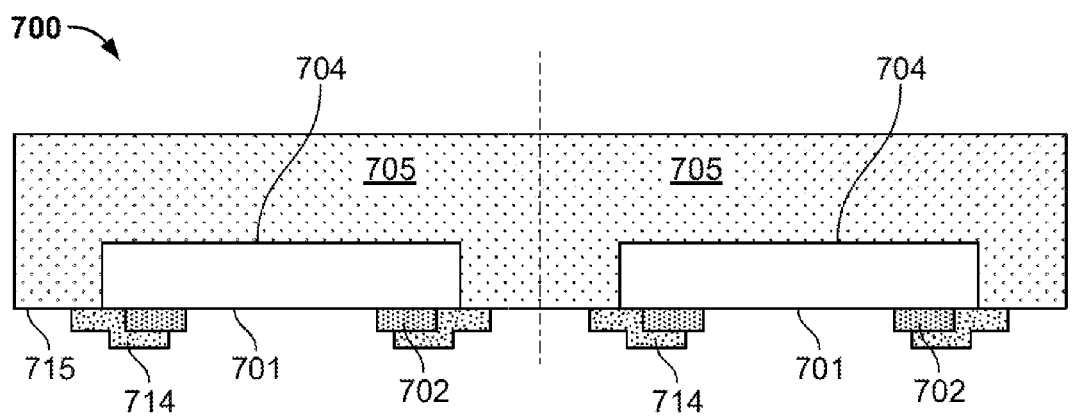
FIGS. 7a-7b are sectional views of the reconstituted wafer shown in FIGS. 6a-6b, further illustrating a through via extending through the dielectric element and a contact thereon.
Figure 7B:
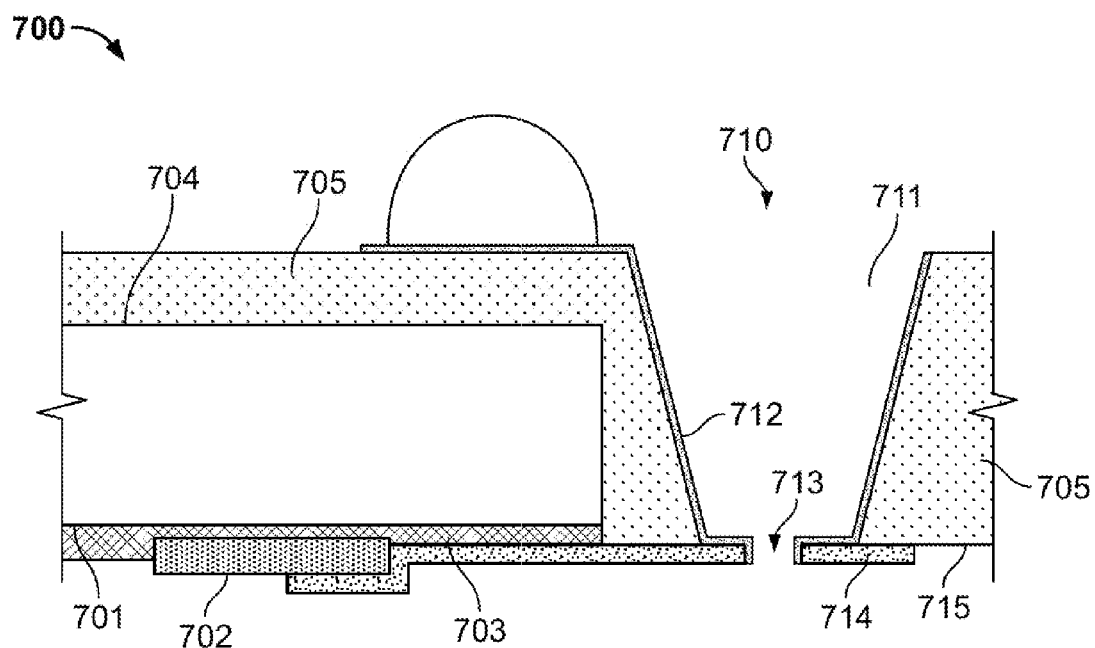

FIGS. 7a and 7b illustrate cross-sectional views through a die formed on a reconstituted wafer 700 according to one embodiment of the invention. Reconstituted wafers are discussed in greater detail in PCT App. US08/09207, filed Jul. 25, 2008, entitled, "RECONSTITUTED WAFER STACK PACKAGING WITH AFTER-APPLIED PAD EXTENSIONS," which claims the benefit of U.S. Provisional App. No. 60/962,200, filed Jul. 27, 2007, entitled, "RECONSTITUTED WAFER STACK PACKAGING WITH AFTER-APPLIED PAD EXTENSIONS," the disclosures of which are both incorporated by reference herein. Further, additional detail is provided in U.S. patent application Ser. No. 12/143,743, filed Jun. 20, 2008, entitled, "RECONSTITUTED WAFER LEVEL STACKING," claiming the benefit of U.S. Provisional App. No. 60/936,617, filed Jun. 20, 2007, entitled, "RECONSTITUTED WAFER LEVEL STACKING," which is also incorporated by reference herein.

Overlying the die face 701 is the die bond pad 702 and its associated dielectric coating 703 on the die. The die is surrounded on its sides and rear face 704 by a dielectric fill 705 of the reconstituted wafer. The through via 710 (FIG. 7b) is stepped, and has a first through hole 711 and a second through hole 713. The first through hole 711 has a tapered profile to aid deposition of the conductive coating 712 on a wall of the first through hole 711. A second bond pad 714 is formed on a lower surface 715 of the dielectric fill layer 705, the second bond pad 714 being conductively connected to the die bond pad 702. The conductive coating 712 extends along walls of the second through hole 713 in the second bond pad 714. In this way, a via extension in the second through hole 713 makes conductive contact with the second bond pad 714. After application of the conductive coating to this region, the result is a frusto-conical T-style contact between the second bond pad 714 and the via extension 713.

Machining of TSVs through semiconductor die and machining of through vias penetrating dielectric layers may be accomplished by a variety of processes. In some instances a combination of processes may offer manufacturing advantages so that, for example, plasma etching is used to machine through the thickness of the silicon to produce a tapered via and the hole is extended through the bond pad by laser ablation. The resulting structure has the benefit that the taper angle through the silicon aids application of coatings to the wall of the TSV, while the laser ablation can be used to create a small diameter hole through the bond pad. The interconnect can thus have a stepped diameter structure, as illustrated for a die built from a reconstituted wafer in FIG. 7. This increases the alignment tolerances and also permits contact to a bond pad that is smaller in area than the base of the main hole. An additional benefit is that a TSV having a taper angle can generally be produced with a lower ohmic resistance than a purely vertical via, owing to the combination of a larger surface area and increased thickness of metal applied for a given deposition time compared with a parallel-sided via.

Using such a two-step process (FIG. 7) to form the TSV has benefits for certain embodiments of the structure. As referred to above, when the TSV extends through a semiconductor die, it is usually a requirement that the metal on the wall of the TSV is electrically isolated from the semiconductor substrate and any other conductive structures through which it passes, excepting, of course, the bond pad to which connection is sought. An effective and reliable means of applying a continuous and uniform thickness dielectric film to all surfaces of a part, irrespective of whether they are exposed surfaces or obscured by a high aspect ratio via is to electrocoat the dielectric film, e.g., by electrophoretic deposition. Commonly owned U.S. application Ser. Nos. 11/590,616 filed Oct. 31, 2006 and 11/789,694 filed Apr. 25, 2007 describe methods of electrophoretically depositing dielectric layers, over which conductive layers, e.g., traces or other conductive interconnects are then formed. These applications are hereby incorporated by reference herein.

Figure 8A:
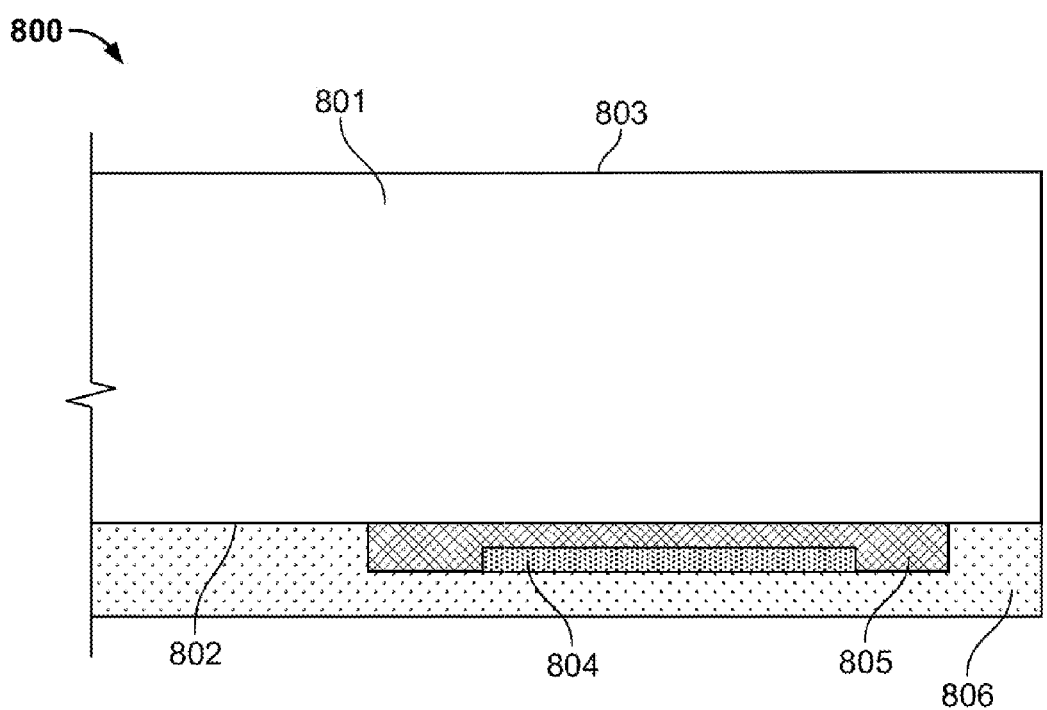
FIGS. 8a-8f are sectional views illustrating stages in a process of forming a conductive via according to one embodiment of the invention.
Figure 8B:
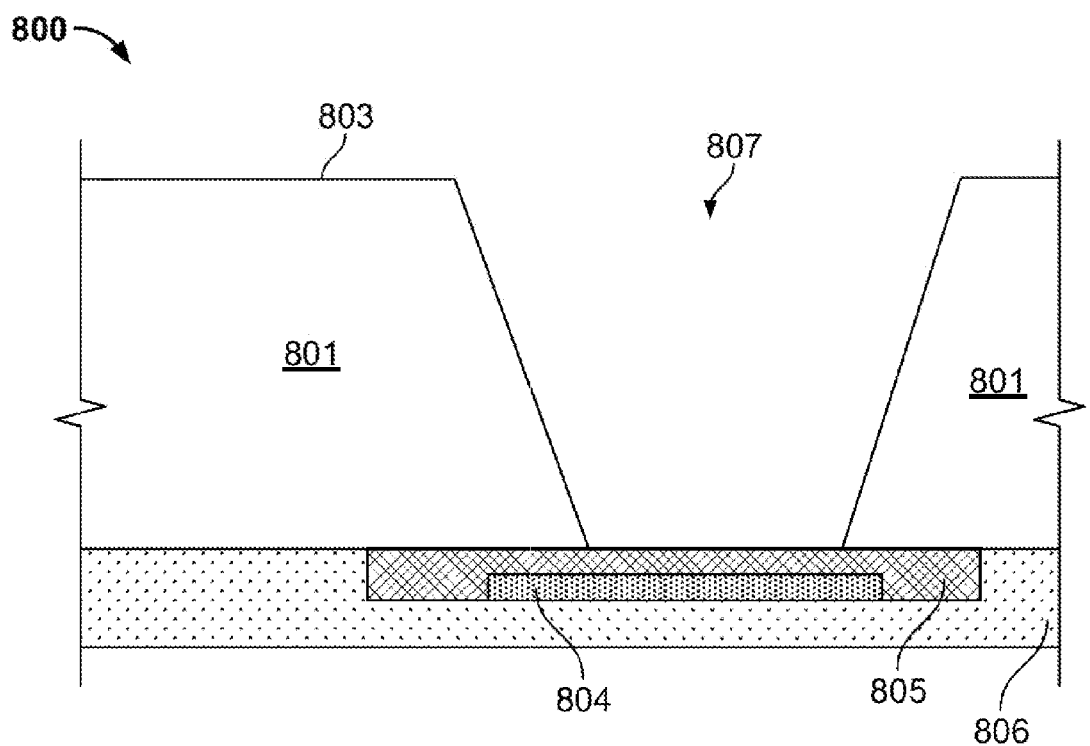
Figure 8C:
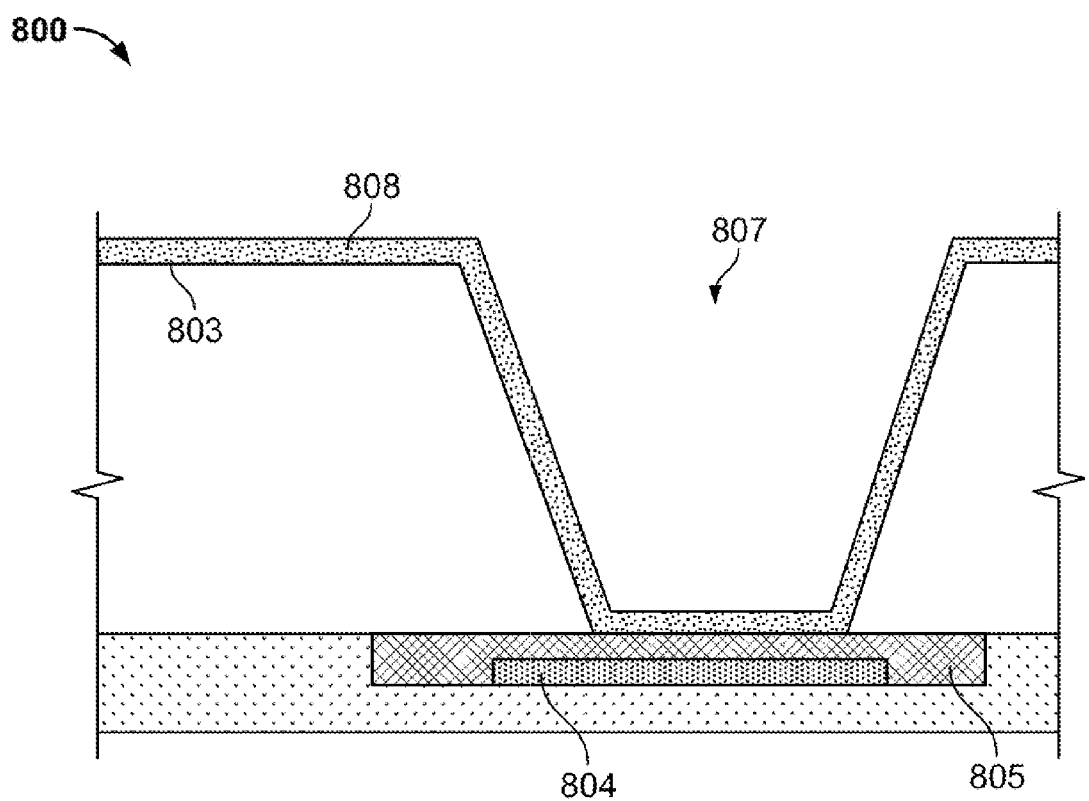
Figure 8D:
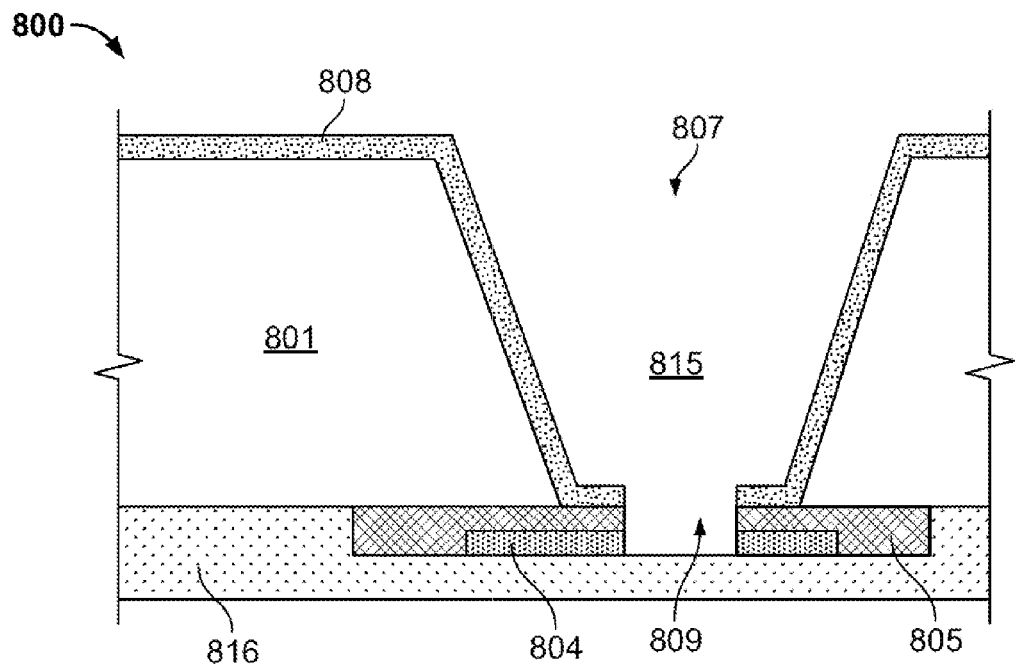
Figure 8E:
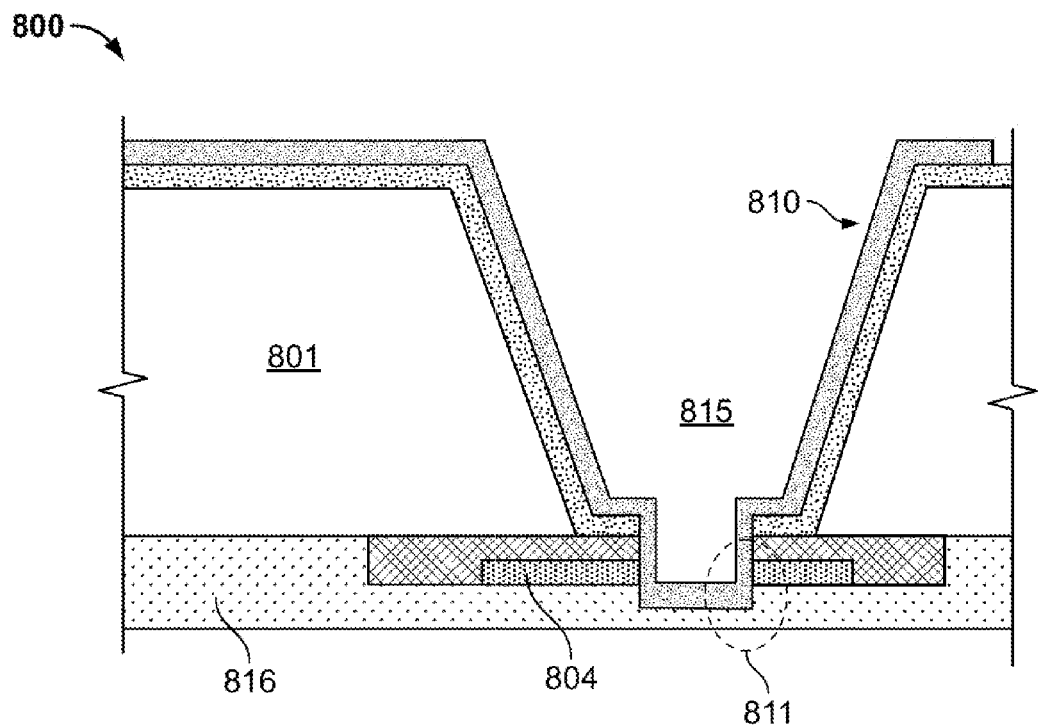
Figure 8F:
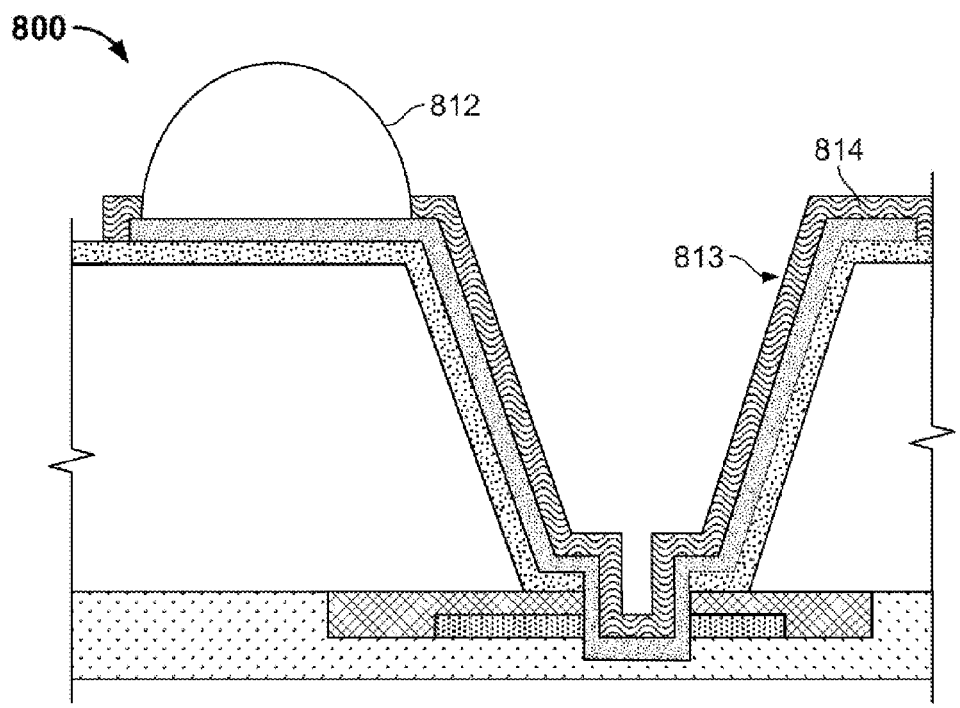

FIGS. 8a thru 8f illustrate a process for forming a TSV according to one embodiment of the invention. FIG. 8f illustrates a cross-sectional view of a TSV extending through semiconductor die according to one embodiment of the invention.

FIG. 8a illustrates a partial cross-section through a semiconductor die 801. The front face 802 of the die is opposite, i.e., remote from its rear face 803 and includes a bond pad 804 that is isolated from the semiconductor die 801 by a dielectric film 805. The die is shown with protective dielectric film 806 covering all of its features. This film 806 is representative of structures which can be present in certain types of die packages such as, any variety of compliant layers, die attach films, die stacking adhesives, or combination thereof.

FIG. 8b illustrates forming a first hole extending from the rear surface 802 of the die 801 to the active surface of the die. For one embodiment, the first hole 807 has a bottom surface positioned above the dielectric film 805. A plasma etch process may be used to form a first hole 807 through the thickness of the silicon in accordance with one embodiment. Because the plasma process is material selective, the first hole 807 stops at the dielectric film 805 on which the bond pad 804 sits. The first hole 807 can have a tapered profile, having the largest area at the rear face 803 of the die. Such a tapered profile may aid subsequent coating of its surfaces. For alternative embodiments, first hole 807 may be formed by wet etching or mechanical milling.

FIG. 8c illustrates forming an insulative coating 808 over the rear surface 803 of the die according to one embodiment. The insulative coating 808 forms an insulative layer within the first hole 807. In one embodiment, a dielectric film, e.g., an electrocoat material, may be applied to the rear face of the die, such as by electrophoretic deposition. By the nature of the electrocoat material this will be conformal and therefore coat the walls of the first hole 807 as well as the dielectric film 805 underneath the bond pad 804. For alternative embodiments, other dielectric films such as solder mask or photo-resist may be used.

FIG. 8d illustrates forming a second hole 809 extending through the insulative layer 808, dielectric film 805 and bond pad 804 according to one embodiment. As seen in FIG. 8d, the diameter of the second hole 809 is contained within the bond pad 804.

For one embodiment, laser ablation may be used to form the second hole 809 through the thickness of insulative material 808, the dielectric film 805 and the bond pad 804. If there is nothing over the bond pad, then the result is a through hole. However, in this instance, the front face of the die is covered by a dielectric material 816. In that case, it is possible for the laser ablated second hole to pass through the dielectric film and the bond pad and terminate in the die covering 816, effectively forming a closed hole or a blind hole. For one embodiment, the die covering 816 may be formed of solder mask. Furthermore, the die covering 816 may be used to form the side walls of a cavity between the die and a glass layer (not shown). A stepped through hole 815, through die 801 and bond pad 804, is formed by the first hole 807 and the second hole 809 and extends from the rear surface 803 of the die thru the bond pad 804.

FIG. 8e illustrates forming a conductive layer 810 that can include metal, according to one embodiment. The conductive layer 810 is then applied to the inside surfaces of the through hole 815 created by the first and second holes. Because the stepped through hole 815 passes through the bond pad 804, it will form a radially symmetric T-style contact 811. The TSV can be formed by coating the holes with metal or by filling the holes with metal.

One process that can be used for applying a metal coating is a vapor phase deposition, examples of which include evaporation and sputtering. These processes will also deposit metal on the rear face of the die. By patterning this film it is possible to create a BGA interface 812 where each site for a solder ball is connected to a via and the die bond pad as seen in FIG. 8f. The thickness of the applied metal may be substantially increased by about an order of magnitude by additional processing such as electroplating. In another embodiment, the via can be filled completely with an electrically conductive material.

Thereafter, a layer 813 of dielectric material can be deposited overlying the conductive layer 810 in the holes as shown in FIG. 8f. Exposed metal of the wiring traces can be covered by an organic protective dielectric coating. A common material is solder mask. The completed structure can then appear as shown in FIG. 8f.

FIGS. 8a thru 8f illustrate the formation of vias to provide electrical contact between a bond pad formed on a die and a BGA interface according to an embodiment of the present invention. The holes extend from the rear surface of the die through the bond pad. Furthermore, the diameter of the second hole does not extend beyond the perimeter of the bond pads. For alternative embodiments, the first and second holes need not be circular. The first hole can be greatly elongated to form a notch or trench that spans several bond pads. Second holes then pass through bond pads at the base of the notch or trench on a singular basis. This embodiment requires the metal coating on the sidewall of the notch or trench to be patterned unless it is desired that a row of bond pads are connected in parallel. This is sometimes the case for bond pads that supply electrical power to a semiconductor.

Typical dimensions for both die bond pads or bond pads on dielectric regions of reconstituted wafers are in the region of 100 μm on a side. A typical TSV will have a diameter of about 50 μm if parallel-sided, and about 50 μm at the base and about 80 μm at the opening if tapered. The extension of the TSV through the bond pad will be slightly smaller at around 20 μm diameter.

All of the preceding examples refer to the case where one TSV intersects a single bond pad or a stack of bond pads. One reason for this is that the conductive coating on the via is a single sheet of metal and therefore presents one electrical pathway. The technology exists to pattern metal on the interior of vias. Therefore, a single via could be used to intersect and connect to multiple bond pads. In this instance each T-style contact would not be a complete circle or oval, but an arc. This embodiment is illustrated in FIG. 9.

Figure 9:
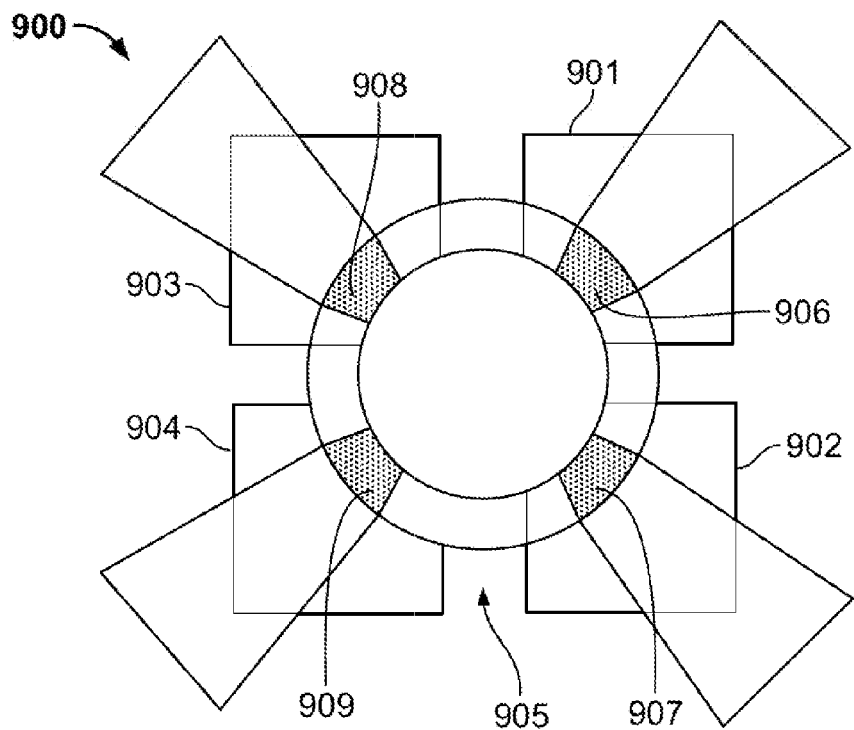
FIG. 9 is a plan view illustrating a microelectronic unit in which conductive interconnects to multiple bond pads extend through a common opening.

FIG. 9 provides a plan view of a TSV located over four bond pads according to one embodiment of the invention. The TSV has patterned metal on the side walls, permitting a separate pathway to be made to each bond pad. Four bond pads 901, 902, 903 and 904 are exposed at the front face of the die. A tapered via 905 passes through a portion of all four bond pads. The metal on the TSV is patterned 906, 907, 908 and 909 to provide individual arcs of T-style contacts to the bond pads.

Figure 10A:
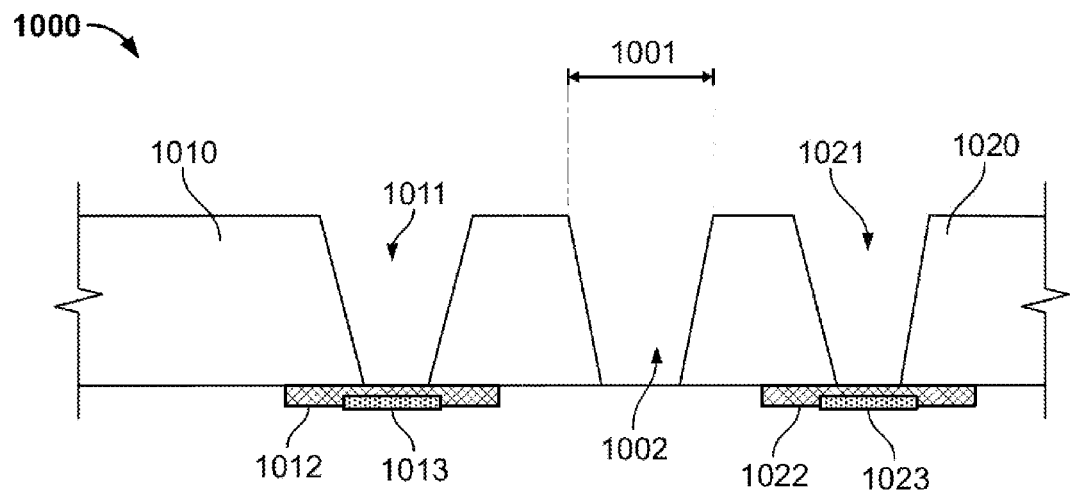
FIG. 10a is a sectional view illustrating a portion of a wafer and openings in and between two adjacent semiconductor elements, e.g., die, according to one embodiment of the invention.
Figure 10B:
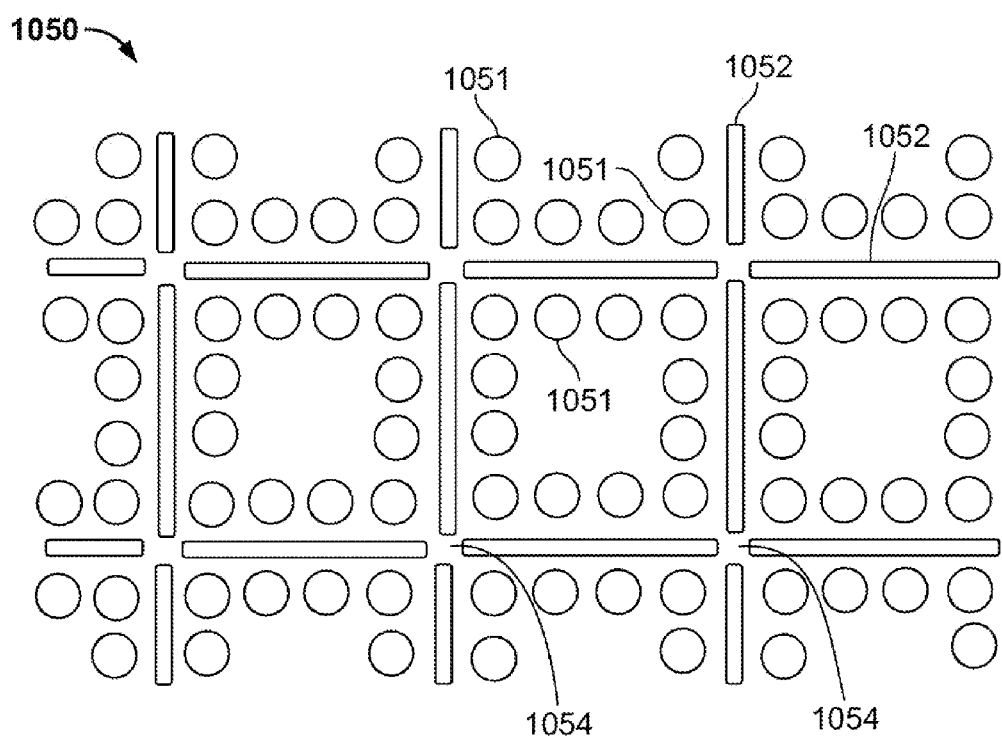
FIG. 10b is a corresponding plan view illustrating several adjacent die in the portion of the wafer shown in FIG. 10a, according to one embodiment of the invention.

Formation of the TSVs is preferably done at the wafer level since it allows all of the structures to be fabricated in parallel, so the process costs are shared among all of the yielding parts. Following completion of such processing, the wafer must be singulated to free individual die. This may be accomplished by mechanical sawing. Alternatively, it can be organised so that when the semiconductor is being machined to form the hole of the TSV, material is also removed from the dicing street, as shown in FIG. 10a. Singulation then involves removing or cutting through any material present in the dicing street on the front of the wafer, or simply cleaving it. All of these processes are quicker to perform than dicing through the full thickness of the semiconductor plus those layers. Although the TSVs used for electrical connection are preferably circular, it will be apparent that to separate the die on the wafer, the TSVs fabricated in the streets can be in the form of a slot in the street (dicing lane) between each die, as illustrated in FIG. 10b. The die can remain connected by small ligaments of semiconducting material at each corner as this retains electrical continuity over the entire rear surface of the wafer from a single point of electrical contact. This attribute can be helpful for the next process step which is the application of the electrocoat dielectric film.

FIGS. 10a and 10b indicate how a process used to form a TSV can be used to simultaneously remove the semiconductor material from the dicing street (dicing lane), aiding subsequent singulation of die from a wafer according to one embodiment of the invention. Shown in FIG. 10a is a dicing street 1001 between two adjacent die 1010 and 1020 on a wafer. Each die has a TSV 1011/1021 hole formed through the silicon to the dielectric film 1012/1022 underneath the bond pad 1013/1023. By the same machining process used to form the TSVs that will be used for electrical connections, another TSV 1002 has been fabricated in the dicing street. By removing this portion of the wafer material the die are effectively singulated with out need for a subsequent dicing process. FIG. 10b is a plan view 1050 of the rear face of several adjacent die on a wafer. Circular TSVs 1051 have been formed to contact each bond pad, while slot-shaped TSVs 1052 have been machined in the dicing streets at the same time as part of the singulation process. Ligaments of semiconductor 1054 remain at each intersection of four die corners to provide the electrical continuity of the wafer face for the subsequent electrocoat process.

Features of the various embodiments described herein can be combined to form microelectronic units having some or all of the features of one described embodiment and one or more features of another described embodiment. Applicants intend by this disclosure to permit all such combination of features, even though such combinations may not be expressly described.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of making a microelectronic unit comprising:
forming a first hole extending from a rear face of a microelectronic element at least partially through a thickness of a semiconductor region of the microelectronic element towards an element contact at a front face of the microelectronic element;
forming a second hole extending through the element contact, the element contact having an outer surface facing away from the microelectronic element, an inner surface opposite from the outer surface, and a wall surface extending within the element contact from the inner surface to the outer surface;
lining portions of the first hole and second hole with a monolithic dielectric layer, at least a portion of the monolithic dielectric layer overlying at least a portion of the inner surfaces of the element contact; and
forming a unit contact exposed at the rear face and forming an electrically conductive layer contacting the wall surface of the element contact, the electrically conductive layer coupled with the element contact.

2. The method of claim 1, wherein the step of forming an electrically conductive layer further comprises forming the conductive layer to overlie the monolithic dielectric layer and to extend along the first hole, the second hole, and at least a portion of the wall surface of the contact.

3. The method of claim 2, wherein the step of forming an electrically conductive layer further comprises forming the conductive layer over the entire wall surface of the contact.

4. The method of forming a microelectronic element as claimed in claim 1, wherein the element contact is separated from the front face by a second dielectric layer.

5. The method of forming a microelectronic element as claimed in claim 4, wherein the monolithic dielectric layer is formed to overlie the second dielectric layer and the second hole extends through the second dielectric layer.

6. The method of forming a microelectronic element as claimed in claim 1, wherein the monolithic dielectric layer is formed by electrophoretic deposition.

7. The method of forming a microelectronic element as claimed in claim 1, wherein the monolithic dielectric layer can be selected from a group consisting of an electrocoat material, solder mask or photo-resist.

8. The method of forming a microelectronic element as claimed in claim 1, wherein the second hole is formed by laser ablation.

9. The method of forming a microelectronic element as claimed in claim 1, wherein the step of lining portions includes filling the first and second holes with a conductive material.

10. The method of forming a microelectronic element as claimed in claim 1, wherein the step of forming a unit contact includes depositing a conductive material by at least one of vapor phase deposition, evaporation or sputtering.

11. The method of forming a microelectronic element as claimed in claim 1, wherein the unit contact includes a conductive ball of a ball grid array adjacent the rear face of the microelectronic element.

12. The method of forming a microelectronic element as claimed in claim 1, wherein the monolithic dielectric layer includes a solder mask.

13. A method of forming a microelectronic unit comprising:
etching a hole extending from a rear face of a microelectronic element through an element contact at a front face of the microelectronic element, the element contact having an inner surface facing the front face, an opposed outer surface, and a wall surface extending between the inner surface and outer surface, the step of etching the hole including etching the hole to extend through a semiconductor material included in the microelectronic element so as to expose a surface of a dielectric layer between the element contact and the semiconductor material; then forming an insulative layer along a wall of the hole in the semiconductor material; and then extending the hole through the insulative layer and the element contact; and
forming a unit contact exposed at the rear face and forming an electrically conductive layer contacting the wall surface of the element contact, the electrically conductive layer coupled with the element contact.

14. The method as claimed in claim 13, wherein the insulative layer is a dielectric layer.

15. The method as claimed in claim 13, wherein the step of forming an electrically conductive layer further comprises forming the conductive layer over the entire wall surface of the element contact.

16. The method as claimed in claim 13, wherein the insulative layer includes a solder mask.

* * * * *